US012572068B2

(12) United States Patent
Jeong et al.

(10) Patent No.: US 12,572,068 B2
(45) Date of Patent: Mar. 10, 2026

(54) TIN COMPOUNDS CONTAINING A TIN-OXYGEN DOUBLE BOND, A PHOTORESIST COMPOSITION CONTAINING THE SAME AND A METHOD OF FORMING A PHOTORESIST PATTERN USING THE SAME

(71) Applicant: INDUSTRY FOUNDATION OF CHONNAM NATIONAL UNIVERSITY, Gwangju (KR)

(72) Inventors: Hyun-Dam Jeong, Gwangju (KR); Wonchul Kee, Gwangju (KR); Gahyun Lee, Gwangju (KR); Hyeok Yun, Jeollanam-do (KR)

(73) Assignee: INDUSTRY FOUNDATION OF CHONNAM NATIONAL UNIVERSITY, Gwangju (KR)

( * ) Notice: Subject to any disclaimer, the term of this patent is extended or adjusted under 35 U.S.C. 154(b) by 0 days.

(21) Appl. No.: 18/891,182

(22) Filed: Sep. 20, 2024

(65) Prior Publication Data

US 2025/0102909 A1 Mar. 27, 2025

(30) Foreign Application Priority Data

Sep. 22, 2023 (KR) ........................ 10-2023-0126829
Sep. 11, 2024 (KR) ........................ 10-2024-0123966

(51) Int. Cl.
*G03F 7/004* (2006.01)
*C07F 7/22* (2006.01)
(Continued)

(52) U.S. Cl.
CPC .......... *G03F 7/0042* (2013.01); *C07F 7/2224* (2013.01); *G03F 7/0046* (2013.01);
(Continued)

(58) Field of Classification Search
CPC .............................. G03F 7/0042; C07F 7/2224
See application file for complete search history.

(56) References Cited

U.S. PATENT DOCUMENTS 4,014,858 A * 3/1977 Chipman ............. C08G 63/183
528/308.8
4,643,913 A 2/1987 Okunana et al.
(Continued)

FOREIGN PATENT DOCUMENTS

CN 111499661 A * 8/2020 ............... D01F 6/28
CN 112447607 A 3/2021
(Continued)

OTHER PUBLICATIONS

English Translation of CN 111499661 A (Year: 2020).*
(Continued)

*Primary Examiner* — Daborah Chacko-Davis
(74) *Attorney, Agent, or Firm* — DICKINSON WRIGHT PLLC

(57) ABSTRACT

A tin compound includes a tin-oxygen double bond, a photoresist composition including the same, and a method for forming a photoresist pattern using the same. In addition, a method for forming a photoresist pattern includes the step of dissociating an organic ligand of an organometallic compound upon light exposure to cause an addition reaction between metal molecules.

2 Claims, 20 Drawing Sheets

(51) Int. Cl.

| | |
|---|---|
| ***G03F 7/00*** | (2006.01) |
| ***G03F 7/16*** | (2006.01) |
| *H01L 21/027* | (2006.01) |

(52) U.S. Cl.
CPC .......... *G03F 7/168* (2013.01); *G03F 7/70033* (2013.01); *H01L 21/0274* (2013.01)

(56) References Cited

U.S. PATENT DOCUMENTS

| | | | |
|---|---|---|---|
| 10,228,618 | B2 | 3/2019 | Meyers et al. |
| 11,579,531 | B2 | 2/2023 | Chang et al. |
| 2015/0234272 | A1 | 8/2015 | Sarma et al. |
| 2017/0102612 | A1 | 4/2017 | Meyers et al. |
| 2019/0308998 | A1 | 10/2019 | Cardineau et al. |
| 2021/0087210 | A1 | 3/2021 | Chang et al. |
| 2022/0194968 | A1 | 6/2022 | Moon |

FOREIGN PATENT DOCUMENTS

| | | | |
|---|---|---|---|
| DE | 3447635 | A1 | 7/1985 |
| JP | 2015-157807 | A | 9/2015 |
| KR | 20180054917 | A | 5/2018 |
| KR | 10-2021-0036774 | | 4/2021 |
| KR | 10-2022-0088011 | A | 6/2022 |
| KR | 10-2521626 | B1 | 4/2023 |
| KR | 10-2024-0103989 | A | 7/2024 |
| KR | 10-2024-0104028 | A | 7/2024 |
| KR | 20240104007 | A | 7/2024 |
| KR | 10-2697518 | B1 | 8/2024 |

OTHER PUBLICATIONS

Extended European Search Report of EP 24 20 1655, mailed May 9, 2025.

Elöd, V. E., et al. “Zur Kenntnis der Zinnsalze organischer Säuren”, Journal of Inorganic and General Chemistry, vol. 164, No. 1, Jul. 26, 1927 (Jul. 26, 1927), pp. 297-312, XP093240853.

Rosenheim A., et al., “Über einige Komplexsalze des vierwertigen Zinns”, Journal of Inorganic Chemistry, vol. 39, No. 1, Mar. 15, 1904 (Mar. 15, 1904) XP093241449.

* cited by examiner (a)

(b)

(a)

(b)

HP: 24 nm

HP: 22 nm

HP : 40 nm

HP: 20 nm

HP: 32 nm

HP: 18 nm

HP: 30 nm

HP: 16 nm

HP : 28 nm

HP: 14 nm

HP: 26 nm

HP: 50 nm

HP: 30 nm

HP : 28 nm

HP: 26 nm

HP: 50 nm

HP: 24 nm

HP: 42 nm

HP: 22 nm

HP : 40 nm

HP: 20 nm

HP: 32 nm

HP: 42 nm
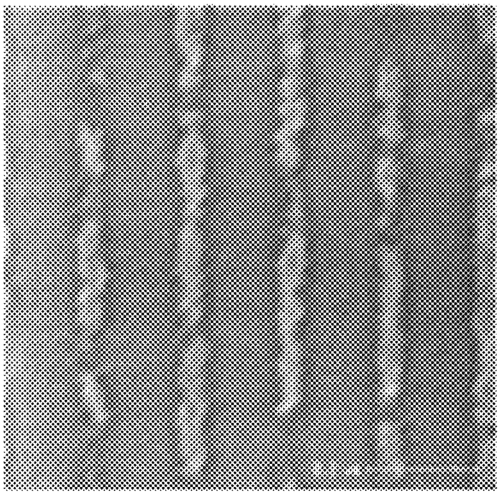
HP: 50 nm
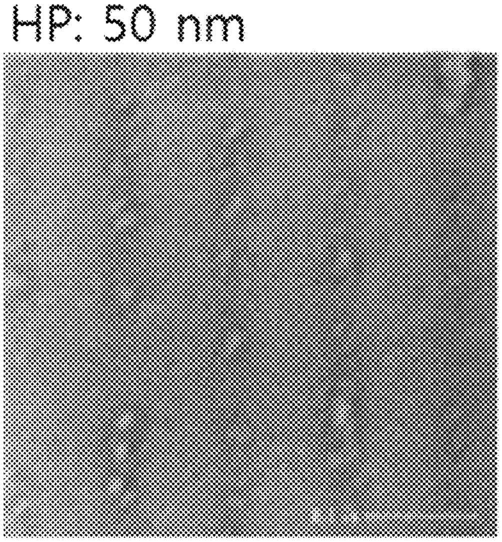

TIN COMPOUNDS CONTAINING A TIN-OXYGEN DOUBLE BOND, A PHOTORESIST COMPOSITION CONTAINING THE SAME AND A METHOD OF FORMING A PHOTORESIST PATTERN USING THE SAME

CROSS-REFERENCE TO RELATED APPLICATIONS

This application claims priority under 35 U.S.C. § 119 to Korean Patent Application No. 10-2023-0126829, filed on Sep. 22, 2023 and No. 10-2024-0123966, filed on Sep. 11, 2024, in the Korean Intellectual Property Office, the disclosure of which is incorporated herein by reference in its entirety.

TECHNICAL FIELD

The following disclosure relates to a tin compound comprising a tin-oxygen double bond, a photoresist composition comprising the same, and a method for forming a photoresist pattern using the same.

BACKGROUND

Research is continuing on the miniaturization of semiconductor patterns which is essential for manufacturing a highly integrated semiconductor device. Semiconductor miniaturization reached its limits in the early 2000s. In the beginning, the miniaturization was carried out through a lithography process using a light source having a short wavelength, but after a 90 nm technical node, innovative technology to maintain high performance and low power as well as simple miniaturization was introduced. Though miniaturization continues without a change in a light source by development of lithography technology such as ArF immersion technology and double patterning, problems of process complexity and increased costs were caused. As EUV lithography technology was introduced to 7 nm grade semiconductor mass production in 2020, related studies are actively being conducted.

In a photolithography process, a design drawn on a mask is patterned on a wafer surface using light, as a step of drawing a circuit in a semiconductor manufacturing process. A photoresist undergoes a chemical change to form a pattern when being exposed to radiation such as ultraviolet (UV) rays, extreme ultraviolet (EUV) rays, and electron beams. In a positive-tone resist, an exposed area is selectively removed, and in a negative-tone resist, a non-exposed area is removed.

A photoresist is classified into a chemical amplified resist (CAR) and a non-chemical amplified resist, and the CAR may amplify a reaction even with a small amount of light by comprising a photoacid generator which generates acid by light. However, CAR may cause a line edge roughness (LER) problem and non-uniformity of pattern formation due to a stochastic effect. A chemical stochastic effect refers to randomness occurring in a reaction process of a chemical substance in a photoresist, and is affected by various factors such as reactivity, molecular movement, and reaction mechanism. Photon stochastics is the randomness occurring in the number of photons irradiated on the photoresist and their distribution, and a fluctuation range may be increased particularly in low light exposure.

In order to solve the problem, an inorganic photoresist is being studied. Since the inorganic photoresist has excellent etching resistance and mechanical strength, it may be stably formed even in an ultra-fine pattern, and in particular, may maintain high sensitivity due to its high EUV absorption rate. In particular, a photoresist comprising inorganic elements such as tin (Sn), indium (In), and hafnium (Hf) boasts better EUV sensitivity and etch resistance than a conventional organic photoresist.

Though in recent studies, a tin oxide cluster shows a high EUV absorption rate and excellent line etch roughness (LER) properties, further studies for improving EUV sensitivity are needed. Development of the inorganic photoresist overcomes a limitation of the conventional organic resist, provides resolution and sensitivity for forming ultra-fine pattern, and is evaluated as an important technological advance for solving a pattern breaking problem.

RELATED ART DOCUMENTS

Patent Document

Korean Patent Laid-Open Publication No. 10-2024-0103989 A (Jul. 4, 2024)

Korean Patent Laid-Open Publication No. 10-2024-0104028 A (Jul. 4, 2024)

SUMMARY

An embodiment of the present disclosure is directed to providing a novel tin compound comprising a tin-oxygen double bond having excellent light sensitivity and etch resistance.

Another embodiment of the present disclosure is directed to providing a photoresist composition comprising the tin compound.

Another embodiment of the present disclosure is directed to providing a method for forming a photoresist pattern capable of preventing decreased reproducibility of a photoresist pattern due to external environment.

Still another embodiment of the present disclosure is directed to providing a method for forming a photoresist pattern capable of a high-quality photoresist pattern without reaction with a gas molecule.

In one general aspect, a tin compound comprises: a central skeleton comprising a tin-oxygen double bond useful as a photoresist material; and an organic ligand bonded to the central skeleton.

As an example embodiment, the central skeleton may be tin dioxide (O═Sn═O) or tin monoxide (O═Sn), and the organic ligand may be any one selected from the group consisting of formic acid, C1-C10 alkyl carboxylic acid, C2-C10 alkenyl carboxylic acid, C3-C10 cycloalkyl carboxylic acid, C6-C20 aryl carboxylic acid, haloC1-C10 alkyl carboxylic acid, C1-C10 alkylcarbonyloxy, C2-C10 alkenylcarbonyloxy, C3-C10 cycloalkylcarbonyloxy, C6-C20 arylcarbonyloxy, haloC1-C10 alkylcarbonyloxy, C1-C10 alkylcarbonylamine, and haloC1-C10 alkylcarbonylamine.

As an example embodiment, the tin compound may be represented by the following Chemical Formulae 1 to 4:

[Chemical Formula 1]

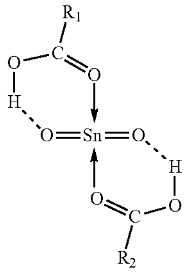

[Chemical Formula 2]

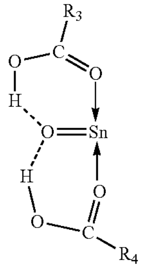

[Chemical Formula 3]

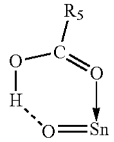

[Chemical Formula 4]

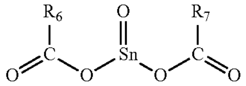

wherein $R_1$ to $R_7$ are independently of one another hydrogen, C1-C10 alkyl, or haloC1-C10 alkyl.

Specifically, $R_1$ to $R_4$ may be independently of one another C1-C5 alkyl or haloC1-C5 alkyl; and $R_5$ to $R_7$ may be independently of one another hydrogen, C1-C5 alkyl, or haloC1-C5 alkyl.

In another general aspect, a photoresist composition comprises the tin compound described above.

The photoresist composition may form a pattern in any development process by expressing a chemical contrast by an addition reaction between inorganic components upon irradiation to extreme ultraviolet (EUV) rays or electron beam in an inorganic resist for extreme ultraviolet (EUV) rays and/or electron beam lithography.

Specifically, the photoresist may be a photoresist for extreme ultraviolet (EUV) rays.

In still another general aspect, a method for forming a photoresist pattern comprises: dissociating an organic ligand of an organometallic compound upon light exposure to cause an addition reaction between metal molecules.

As an example embodiment, the method for forming a photoresist pattern comprises: (a) applying a photoresist composition comprising an organometallic compound on a substrate to form a thin film; (b) exposing the thin film to light; (c) developing the exposed thin film using a developing solution.

As an example embodiment, the organometallic compound may comprise a central skeleton comprising a tin-oxygen double bond; and an organic ligand bonded to the central skeleton.

As an example embodiment, the central skeleton may be tin dioxide (O═Sn═O) or tin monoxide (O═Sn).

As an example embodiment, the light exposure in (b) may be performed by any one of electron beam (E-beam), extreme ultraviolet (EUV) rays, i-line, krypton fluoride (KrF) laser, argon fluoride (ArF) laser, deep ultraviolet (DUV) rays, vacuum ultraviolet (VUV) rays, X-rays, and ion beam.

Other features and aspects will be apparent from the following detailed description, the drawings, and the claims.

BRIEF DESCRIPTION OF THE DRAWINGS

FIG. 22 shows results of observing a pattern irradiated with a light exposure amount of 40 mJ/$cm^2$ with CD-SEM in Example 9.

DETAILED DESCRIPTION OF EMBODIMENTS

Figure 1:
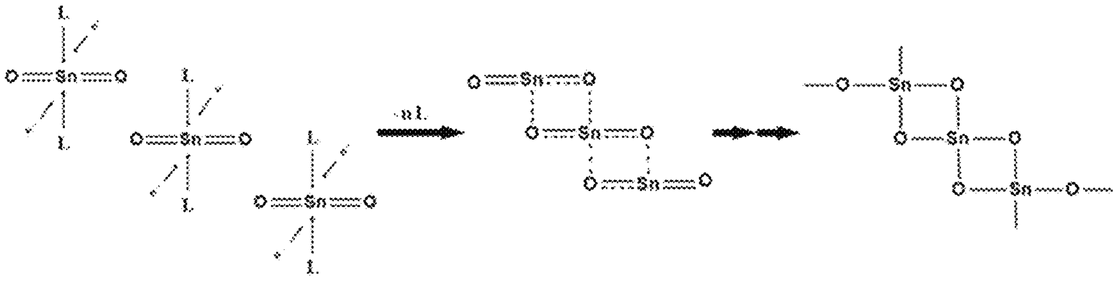
FIGS. 1 and 2 show schematic diagrams of mechanisms of a method for forming a photoresist pattern according to an example embodiment of the present disclosure.

In the present specification, unless otherwise defined, all technical terms and scientific terms have the same meanings as those commonly understood by a person skilled in the art to which the present disclosure pertains. The terms used herein are only for effectively describing a certain specific example and are not intended to limit the present disclosure.

In addition, the singular form used in the specification and claims appended thereto may be intended to comprise a plural form also, unless otherwise indicated in the context.

In addition, the numerical range used in the present specification comprises all values within the range comprising the lower limit and the upper limit, increments logically derived in a form and span of a defined range, all double limited values, and all possible combinations of the upper limit and the lower limit in the numerical range defined in different forms. Unless otherwise defined in the specification of the present disclosure, values which may be outside a numerical range due to experimental error or rounding off of a value are also comprised in the defined numerical range.

Furthermore, throughout the present specification, unless otherwise particularly stated, "comprising", "being equipped with", "containing", or "having" a constituent element does not mean excluding any other constituent element, but mean further comprising other constituent elements, and elements, materials, or processes which are not further listed are not excluded.

In the present specification, "room temperature" may refer to a temperature which is not artificially adjusted, and may be, for example, 20° C. to 40° C., 20° C. to 30° C., 23° C. to 26° C., or 21° C. to 23° C.

The term "alkyl" used in the present specification refers to a saturated straight chain or branched acyclic hydrocarbon having 1 to 10, preferably 1 to 5 carbon atoms. Representative saturated straight chain alkyl comprises -methyl, -ethyl, -n-propyl, -n-butyl, -n-pentyl, -n-hexyl, -n-heptyl, -n-octyl, -n-nonyl, and -n-decyl; however, saturated branched alkyl comprises -isopropyl, -sec-butyl, -isobutyl, -tert-butyl, isopentyl, 2-methylhexyl, 3-methylbutyl, 2-methylpentyl, 3-methylpentyl, 4-methylpentyl, 2-methylhexyl, 3-methylhexyl, and the like.

The term "alkenyl" used in the present specification refers to a group derived from a straight chain or branched hydrocarbon comprising one or more double bonds.

In the present specification, when "C1-C10" is described, it means that the number of carbon atoms is 1 to 10. For example, C1-C10 alkyl refers to alkyl having 1 to 10 carbon atoms.

The terms "halogen" and "halo" used in the present specification refer to fluorine, chlorine, bromine, or iodine.

The term "haloalkyl" used in the present specification refers to an alkyl group in which one or more hydrogen atoms are substituted with a halogen atom, respectively. For example, the haloalkyl comprises $—CF_3$, $—CHF_2$, $—CH_2F$, $—CBr_3$, $—CHBr_2$, $—CH_2Br$, $—CH_2Cl$, $—CHI_2$, $—CH_2I$, $—CH_2—CF_3$, $—CH_2—CHF_2$, $—CH_2—CH_2F$, $—CH_2—CBr_3$, $—CH_2—CHBr_2$, $—CH_2—CH_2Br$, and the like. Herein, alkyl and halogen are as defined above.

The term "aryl" used in the present specification refers to a carbocyclic aromatic group containing 5 to 10 ring atoms. A representative example comprises phenyl, tolyl, xylyl, naphthyl, tetrahydronaphthyl, anthracenyl, fluorenyl, indenyl, azulenyl, and the like, but is not limited thereto. The carbocyclic aromatic group may be selectively substituted.

The term "cycloalkyl" used in the present specification refers to a monocyclic or polycyclic saturated ring having carbon and hydrogen atoms and no carbon-carbon multiple bond. An example of the cycloalkyl group comprises (C3-C10) cycloalkyl, for example, cyclopropyl, cyclobutyl, cyclopentyl, cyclohexyl, and cycloheptyl, but is not limited thereto. The cycloalkyl group may be selectively substituted. In an example embodiment, the cycloalkyl group is a monocyclic or bicyclic ring.

The terms "carboxylic acid", "carboxyl", and "carboxy" used in the present specification refer to —COOH.

The term "alkyl carboxylic acid" used in the present specification refers to (alkyl)-COOH, in which the carboxylic acid is as defined above.

The term "alkylcarbonyl" used in the present specification refers to —Co-(alkyl), in which the alkyl is as defined above.

The term "alkylcarbonyloxy" used in the present specification refers to a —CO—O—* radical, in which the "alkylcarbonyl" is as defined above.

Hereinafter, the present disclosure will be described in detail. However, it is only illustrative, and the present disclosure is not limited to the specific example embodiment which is illustratively described.

The present disclosure provides a tin compound comprising: a central skeleton comprising a tin-oxygen double bond; and an organic ligand bonded to the central skeleton.

The tin compound of the present disclosure may be thermodynamically stabilized by bonding a tin atom and an oxygen atom by a double bond and bonding an organic ligand and a tin atom. Accordingly, since a dimer formation reaction is suppressed and the tin compound is present in a single molecule form, when the tin compound is used as a photoresist material later, it may have excellent light sensitivity and etch resistance. In addition, a photoresist pattern having excellent resolution, line edge roughness, and mechanical strength may be formed using the photoresist composition comprising the compound.

The central skeleton may be tin dioxide (O═Sn═O) or tin monoxide (O═Sn). Since a conventional tin compound which was mainly used as a photoresist material has a Sn—C or Sn—N central skeleton, when a tin atom and a carbon or nitrogen atom are dissociated upon light exposure, a radical (—Sn·) in which an unpaired electron is present in the tin atom is formed. The radical reacts with moisture or carbon dioxide in the surrounding environment in a process of forming a photoresist pattern to form —Sn—OH (hydroxyl group) or $—Sn—O_3CH$ (carbonate), which forms a Sn—O—Sn crosslink or $Sn—(CO_3)—Sn$ crosslink by a condensation reaction. Since it is difficult to control moisture and carbon dioxide concentration consistently in the real semiconductor manufacturing process, the reproducibility of the photoresist pattern is reduced.

However, the organic ligand of tin compound according to the present disclosure is dissociated upon light exposure, so that a thermodynamically unstable tin dioxide (O═Sn═O) or tin monoxide (O═Sn) molecule is produced, and the molecules may be present within a short distance by the volume occupied by the organic ligand. Accordingly, a cross-sectional area where an addition reaction is allowed may be secured with only a small amount of heat energy supplied upon light exposure.

As an example embodiment, the organic ligand may be a neutral ligand or an anion ligand, but is not necessarily limited as long as the object of the present disclosure is achieved.

As an example, the neutral ligand may be any one or more selected from the group consisting of pyrazole, imidazole, dimethyl sulfide, benzaldehyde, dimethyl sulfoxide (DMSO), pyrrolidine, n-butylamine, aniline, ethylbenzoate, pyrazine, n-propylamine, formamide, benzonitrile, pyrimidine, ethylene diamine, acetamide, methylformamide, t-butylamine, pyridine, propionitrile, triethylamine, ethylamine, diethylamine, pivalic acid, 2-pyrrolidone, water, diglyme, tetrahydrofuran, nitric acid, benzyl alcohol, t-butanol, ethyl benzene, benzoic acid, n-methylpyrrolidone, acetonitrile, furan, diethylformamide, n-propanol, 2-propanol, ethanol, methanol, trifluoroacetic acid, formic acid, dimethylformamide (DMF), 1,4-dioxane, dimethyl acetamide, benzoic acid, acetic acid, 1-butanol, ethyl acetate, dimethoxyethane, ethylene glycol, methoxy ethanol, phenol, and diethyl ether.

As an example, the anion ligand may be any one or more selected from the group consisting of $SiO_4^{4-}$, pyrazolate$^-$, $MeS^-$, $Me_2dtc^-$, $N(EtOH)(EtO)_2^{2-}$, $PhCH_2S^-$, $EtOCS^{2-}$, thioacetate, $N(EtOH)_2(EtO)^-$, salicylate$^{2-}$, $CyS^-$, i-$Pr_2dtc^-$, O-Et-$O^{2-}$, $MeOCS_2^-$, $SiCl_3^-$, Py(COO—$)_3^{3-}$, $CH_2S_2^{2-}$, $Et_2NCOO^-$, i-$Pr_2NCOO^-$, $Si(PhCOO)_4^{4-}$, $OCS_2^{2-}$, $H_2$-citrate$^-$, H-citrate$^{2-}$, $CN^-$, $EtS^-$, $AsO_4^{3-}$, $AsO_3^{3-}$, i-$PrO^-$, $Et_2dtc^-$, i-$PrS^-$, pyrrolidine-dtc$^-$, $O_2^-$, $PhS^-$, o-$PhO_2^{2-}$, $CF_3CF_2COO^-$, o-$Ph(CH_2COO)_2^{2-}$, m-$Ph(CH_2COO)_2^{2-}$, citrate$^{3-}$, $N^{3-}$, $PO_4^{3-}$, $OCN^-$, t-$BuS^-$, Et-$COO^-$, malate, n-$Pro^-$, i-$PrOCS^{2-}$, $NO^{2-}$, glycinate, $SO_3^{2-}$, $PhCOO^-$, t-Bu-COO-(pivalate)$^-$, $HAsO_4^{2-}$, $PhO^-$, $SeO_3^{2-}$, $SCN^-$, $N(CH_2COO)_3^{3-}$, $PhCH_2O^-$, $MeOCOO^-$, $MeO^-$, Ph(COOH)$(COO)_2^{2-}$, i-Pr—$COO^-$, furandicarboxylate$^-$, NC—N—$CN^-$, $EtO^-$, $HCl_2C$—$COO^-$, HO-Et-$O^-$, m-$Ph(COO)_2^{2-}$, $HPO_4^{2-}$, $SeCN^-$, pyrrolate$^-$, $H_2PO_2^{2-}$, p-$Ph(CH_2COO)_2^{2-}$, imidazolate$^-$, $S^{2-}$, $HCOO^-$, $Ph(COO)_3^{3-}$, o-$Ph(COO)_2^{2-}$, n-$BuO^-$, $CH_3COO^-$, $OH^-$, $Se^{2-}$, t-$BuO^-$, p-$Ph(COO)_2^{2-}$, $N(EtO)_3^{3-}$, MeO-Et-$O^-$, $C_2O_4^{2-}$, $Te^{2-}$, $Cl_3CCOO^-$, $Me_3SiO^-$, HO-Ph-$COO^-$, $CF_3CF_2CF_2COO^-$, $GeCl_3^-$, $Cl^-$, $OTeF_5^-$, EDTA$^{4-}$, n-$PrCOO^-$, $CO_3^{2-}$, $Et(COO)_2^{2-}$, $S_2O_3^{2-}$, $AlMe_4^-$, $BH_3CN^-$, Et(COOH)($COO^-$), $Br^-$, $I^-$, fumarate$^{2-}$, $(O_2N)_2PhCOO^-$, $CF_3COO$—, $BH_4^-$, salicylate$^-$, $SnCl_3^-$, $Ph(COOH)_2(COO)^-$, $(MeO)_2PO_2^-$, $SH^-$, —OOC—C≡C—$COO^-$, $Me_2NCOO^-$, $H_2PO_4^-$, lactate$^-$, p-$O_2NPhO^-$, saccharinate$^-$, tartrate$^{2-}$, $C(CN)_3^-$, $SeO_4^{2-}$, $CH_3SO_3^-$, $HCO_3^-$, $SO_4^{2-}$, m-Ph(COOH)$(COO)^-$, o-Ph(COOH)$(COO)^-$, p-$H_2N$-Ph-$SO_3^-$, $Naph(SO_3)_2^{2-}$, $C_2O_4H^-$, $ClO_3^-$, $HCB_{11}H_{11}^-$, $F^-$, $NO_3^-$, $PhSO_3^-$, $B(PhO_2)_2^-$, $ReO_4^-$, $SiF_6^{2-}$, p-Ph(COOH)$(COO)^-$, p-Me-$PhSO_3^-$ (OTS), $B_{10}H_{10}^{2-}$, $BHEt_3^-$, $B(CN)_4^-$, Picrate, $B_{12}H_{12}^{2-}$, $HCB_{11}H_{11-x}Cl_x^-$, H-tartrate$^-$, $AlCl_4^-$, $CF_3SO_3^-$ (triflate), $HSO_4^-$, $(F_3C)_3C$—$O^-$, triflimidate$^-$, $GaCl_4^-$, $SbCl_6^-$, $ClO_4^-$, $S_2O_6^{2-}$, $AsF_6^-$, $SbF_6^-$, $BF_4^-$, $I_3^-$, $BH(C_6F_5)_3^-$, B(3,5-$PhCl_2)_4^-$, $Al(OC(CF_3)_3)_4^-$, $BMe(C_6F_5)_3^-$, $PF_6^-$, $BPh_4^-$, $B(C_6F_5)_4^-$, and $BArF_4^-$.

As an example embodiment, the organic ligand may be any one selected from the group consisting of formic acid, C1-C10 alkyl carboxylic acid, C2-C10 alkenyl carboxylic acid, C3-C10 cycloalkyl carboxylic acid, C6-C20 aryl carboxylic acid, haloC1-C10 alkyl carboxylic acid, C1-C10 alkylcarbonyloxy, C2-C10 alkenylcarbonyloxy, C3-C10 cycloalkylcarbonyloxy, C6-C20 arylcarbonyloxy, haloC1-C10 alkylcarbonyloxy, C1-C10 alkylcarbonylamine, and haloC1-C10 alkylcarbonylamine, and is preferred in terms of occurrence of a more effective ligand dissociation reaction upon light exposure.

As a preferred example embodiment, the organic ligand may be any one or more selected from the group consisting of formic acid, C1-C10 alkyl carboxylic acid, haloC1-C10 alkyl carboxylic acid, or C1-C10 alkylcarbonyloxy. Specifically, it may be any one or more selected from the group consisting of C1-C5 alkyl carboxylic acid, haloC1-C5 alkyl carboxylic acid, or haloC1-C5 alkylcarbonyloxy. When the corresponding organic ligand is comprised, the tin compound may be more thermodynamically stabilized by an oxygen atom and a tin atom present in the organic ligand being bonded to each other.

As an example, the tin compound may be represented by the following Chemical Formula 1 to 4:

[Chemical Formula 1]

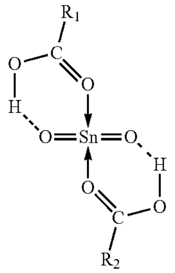

[Chemical Formula 2]

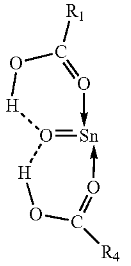

[Chemical Formula 3]

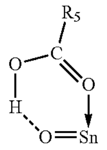

[Chemical Formula 4]

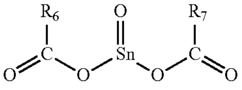

wherein $R_1$ to $R_7$ are independently of one another hydrogen, C1-C10 alkyl, or haloC1-C10 alkyl.

As an example, $R_1$ to $R_7$ may be independently of one another hydrogen, C1-C5 alkyl, or haloC1-C5 alkyl.

As an example, $R_1$ to $R_4$ may be independently of one another C1-C5 alkyl or haloC1-C5 alkyl, and $R_5$ to $R_7$ may be independently of one another hydrogen, C1-C5 alkyl, or haloC1-C5 alkyl.

As an example, $R_1$ and $R_2$ may be identically to each other C1-C5 alkyl or haloC1-C5 alkyl, $R_3$ and $R_4$ may be identically to each other C1-C5 alkyl or haloC1-C5 alkyl, and $R_5$ to $R_7$ may be independently of one another hydrogen, C1-C5 alkyl, or haloC1-C5 alkyl.

As an example, $R_1$ and $R_2$ may be identically to each other C1-C3 alkyl or haloC1-C3 alkyl, $R_3$ and $R_4$ may be identically to each other C1-C3 alkyl or haloC1-C3 alkyl, and $R_3$ to $R_7$ may be independently of one another hydrogen, C1-C3 alkyl, or haloC1-C3 alkyl.

In addition, the present disclosure provides a photoresist composition comprising the tin compound described above.

The photoresist composition according to an example embodiment may form a pattern in any development process by expressing a chemical contrast by an addition reaction between inorganic components upon irradiation with extreme ultraviolet (EUV) rays or electron beam in an inorganic resist for extreme ultraviolet (EUV) rays and/or electron beam lithography.

The organic ligand of the tin compound according to the present disclosure is dissociated upon light exposure due to the structure in which a central skeleton comprising a tin-oxygen double bond and an oxygen atom of the organic ligand are bonded, and the molecules are present within a short distance by the volume occupied by the organic ligand and may be polymerized by an addition reaction.

The photoresist composition according to an example embodiment may be a photoresist composition for extreme ultraviolet (EUV) rays.

Since the photoresist composition according to an example embodiment has excellent light sensitivity and etch resistance, the photoresist pattern using the same may be formed in a small thickness even in an ultra-fine pattern. Besides, a high-quality photoresist pattern having excellent resolution and sensitivity may be formed.

In an example embodiment, the photoresist composition according to the present disclosure may comprise the tin compound and a solvent, and the solvent may be any type as long as the tin compound according to an example embodiment is dissolved in the solvent, and as an example, may be one or two or more selected from the group consisting of water, methanol, acetic acid, chlorobenzene, chloroform, ethyl lactate, and tetrahydrofuran.

In an example embodiment, the photoresist composition may comprise 0.1 to 50 parts by weight of the tin compound as described above, when the total weight of the photoresist composition is 100 parts by weight. Specifically, the tin compound may be comprised at 0.1 to 30 parts by weight, more specifically 0.5 to 10 parts by weight, and more specifically 1 to 5 parts by weight, based on 100 parts by weight of the photoresist composition. When the content of the tin compound satisfies the above range, a photoresist pattern having better resolution and sensitivity may be formed, which is thus preferred.

In addition, the present disclosure provides a method for forming a photoresist pattern comprising: dissociating an organic ligand of an organometallic compound upon light exposure to cause an addition reaction between metal molecules.

According to the method for forming a photoresist pattern according to an example embodiment, since a conventional problem of pattern reproducibility reduced by an external environment such as moisture and carbon dioxide may be prevented and also a high-quality photoresist pattern may be formed without comprising a step of reacting with a gas molecule in a process, the method is industrially very useful.

As an example, the organometallic compound may comprise a metal having excellent light sensitivity as a central metal, and specifically, may be an organotin compound. In addition, an example of an applicable organic ligand is as described above.

Since the method for forming a photoresist pattern according to the present disclosure comprises a step of performing an addition reaction between metal molecules upon light exposure, a conventional problem of pattern reproducibility reduced by an external environment such as moisture and carbon dioxide may be prevented. That is, a high-quality photoresist pattern having excellent reproducibility and process stability may be formed in a large area process.

In addition, the present disclosure provides a method for forming a photoresist pattern comprising: (a) applying the photoresist composition comprising an organometallic compound as described above on a substrate to form a thin film; (b) exposing the thin film to light; and (c) developing the exposed thin film using a developing solution.

As an example embodiment, the organometallic compound may comprise a central skeleton comprising a tin-oxygen double bond; and an organic ligand bonded to the central skeleton.

Figure 2:
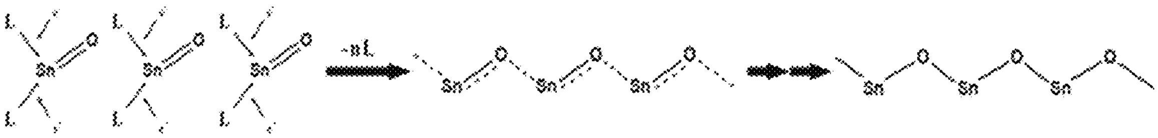

As an example, the central skeleton may be tin dioxide (O═Sn═O) or tin monoxide (O═Sn). According to the method for forming a photoresist pattern according to the present disclosure, the organic ligand of the organometallic compound is dissociated upon light exposure, and the central skeleton molecules are present within a short time by the volume occupied by the organic ligand and may be polymerized with each other by an addition reaction. Schematic diagrams for the corresponding mechanism are shown in FIGS. 1 and 2.

In the method for forming a photoresist pattern according to an example embodiment, the photoresist composition of step (a) may be applied on a substrate using a method known in the art without limitation, and as an example, the photoresist composition may be applied using a method such as spin coating, dipping, roller coating, bar coating, spray coating, inkjet printing, and screen printing, but is not limited thereto.

As an example, the photoresist composition may be applied on a substrate by a spin coating method, and at this time, the thickness of the photoresist film to be desired may be adjusted based on a spinner speed and a coating time. For example, spin coating may be performed at a speed of 100 rpm to 5000 rpm, specifically 2000 rpm to 4000 rpm for 1 second to 60 seconds, specifically 20 seconds to 40 seconds, but is not limited thereto.

In an example embodiment, (b) is a step of exposing the thin film formed in step (a) to light, and the light exposure may be performed by any one selected from electron beam (E-beam), extreme ultraviolet (EUV) rays, i-line, krypton fluoride (KrF) laser, argon fluoride (ArF) laser, deep ultraviolet (DUV) rays, vacuum ultraviolet (VUV) rays, X-rays, and ion beam, and extreme ultraviolet rays or electron beam may be preferred, but the present disclosure is not necessarily limited thereto.

In an example embodiment, after step (a) and before step (b), a step of heating a thin film formed in step (a) may be further comprised. The step of heating the thin film is a post-apply bake (PAB) process, and may be performed at a temperature of 50 to 300° C., specifically 100 to 200° C., or 110 to 180° C. for 0.5 to 10 minutes or 0.5 to 5 minutes, and the solvent comprised in the photoresist composition is removed by the step to improve adhesive strength between the thin film and the substrate.

In an example embodiment, the thickness of the photoresist thin film formed on the substrate may be 1 to 100 nm, 5 to 50 nm, or specifically 5 to 30 nm. Herein, the thickness of the thin film may be measured after applying the photoresist composition on the substrate and then performing the PAB process described above.

The substrate on which the photoresist composition is applied may comprise one or more conductive layers selected from aluminum, copper, molybdenum, titanium, tungsten, an alloy of these metals, a nitride of these metals, or a silicide of these metals placed on a lower base substrate, one or more dielectric layers selected from silicon oxide, silicon nitride, silicon oxynitride, and metal oxide, a semiconductor layer such as monocrystalline silicon, and a combination thereof. Herein, the lower base substrate may have a wafer or film shape, and may be a laminate in which semiconductor, ceramic, metal, polymer, or two or more materials selected therefrom form each layer and are laminated.

As an example, the lower base substrate may be a semiconductor substrate, and a non-limiting example of the semiconductor substrate may be a laminate in which a Group 4 semiconductor comprising silicon (Si), germanium (Ge), or silicon germanium (SiGe), a Group 3-5 semiconductor comprising gallium arsenide (GaAs), indium phosphide (InP), or gallium phosphide (GaP), a Group 2-6 semiconductor comprising cadmium sulfide (CdS) or zinc telluride (ZnTe), a Group 4-6 semiconductor comprising lead sulfide (PbS), or two or more materials selected therefrom form each layer and are laminated. Herein, the semiconductor substrate may have a wafer or film shape, and may be a laminate in which semiconductor, ceramic, metal, polymer, or two or more materials selected therefrom form each layer and are laminated.

In an example embodiment, a step of heating the exposed thin film after step (b) may be further comprised. Specifically, the step of heating the exposed thin film is a post-exposure bake process, and may be performed at 50 to 300° C., and specifically, may be performed at a temperature of 100 to 200° C. or 100 to 150° C. for 1 to 15 minutes or 1 to 5 minutes. Thus, a difference in solubility of a developing solution between an exposed area and a non-exposed area may be further increased.

In an example embodiment, before and/or after the step (b), a UV bake process step of baking a photoresist thin film with ultraviolet (UV) irradiation may be further comprised, and inorganic resist pattern quality such as dose-to-size (DtS), line edge roughness (LER), and half-pitch (HP) may be improved. As an example, a UV bake process may use a UV lamp, an i-line light source, KrF and ArF laser light sources, and the like, but is not necessarily limited thereto.

In an example embodiment, after step (c), a hard bake process step of baking a photoresist thin film may be further comprised, and the hard bake process may further improve the quality of the inorganic resist pattern such as dose-to-size (DtS), line edge roughness (LER), and half-pitch (HP). As an example, the hard bake process may be performed at a temperature of 100° C. to 200° C., specifically 110° C. to 180° C. for 0.5 minutes to 10 minutes, specifically 0.5 minutes to 5 minutes, but is not necessarily limited thereto, and the process conditions may be appropriately changed depending on the used solvent.

As a light source, KrF and ArF laser light sources and the like may be used, but the present disclosure is not limited thereto.

In an example embodiment, the photoresist pattern may be a positive type which is soluble in a developing solution or a negative type which is insoluble in a developing solution by being exposed to light used in a light exposure process, and specifically, may be a negative type. That is, a pattern formed by a photoresist pattern formation method depending on the solubility in the developing solution of the thin film may be a positive type or a negative type pattern, and specifically, a negative type pattern.

In an example embodiment, the step (c) is a step of developing the exposed thin film using the developing solution, and specifically, the developing solution may be any type as long as it is a material known in the art, and as an example, may comprise C2-10 alkene or a quaternary ammonium salt. A specific example of the C2-10 alkene may be hexene. A specific example of the quaternary ammonium salt may be tetramethylammonium hydroxide (TMAH), tetrabutylammonium hydroxide (TBAH), tetrapropylammonium hydroxide (TPAH), tetraethylammonium hydroxide (TEAH), or a mixture thereof. As an example, the developing solution may comprise 1 to 30 wt %, specifically 1 to 5 wt % of a quaternary ammonium salt, but is not necessarily limited thereto.

In addition, the present disclosure provides a semiconductor device comprising a photoresist pattern formed by the method for forming a photoresist pattern described above, and since the semiconductor device comprises the photoresist pattern formed with excellent resolution and sensitivity by the method described above, a higher quality semiconductor device may be implemented.

Hereinafter, the examples and the experimental examples will be illustrated specifically in detail in the following. However, the examples and the experimental examples described later are only a partial illustration, and the technology described in the present specification is not construed as being limited thereto.

[Example 1] Preparation of Tin Compound 1

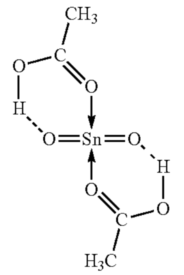

0.304 g of tin oxide powder purchased from QURES Ltd. was placed in a round bottom flask, 16 ml of methanol was added, and 24 ml of acetic acid was added. After stirring at room temperature for 30 minutes, stirring was performed with heating at 70° C. for 15 hours. Thereafter, the solvent was removed with a vacuum pump to obtain tin compound 1 (acetic acid stabilized tin dioxide) as a yellow solid.

Figure 3:
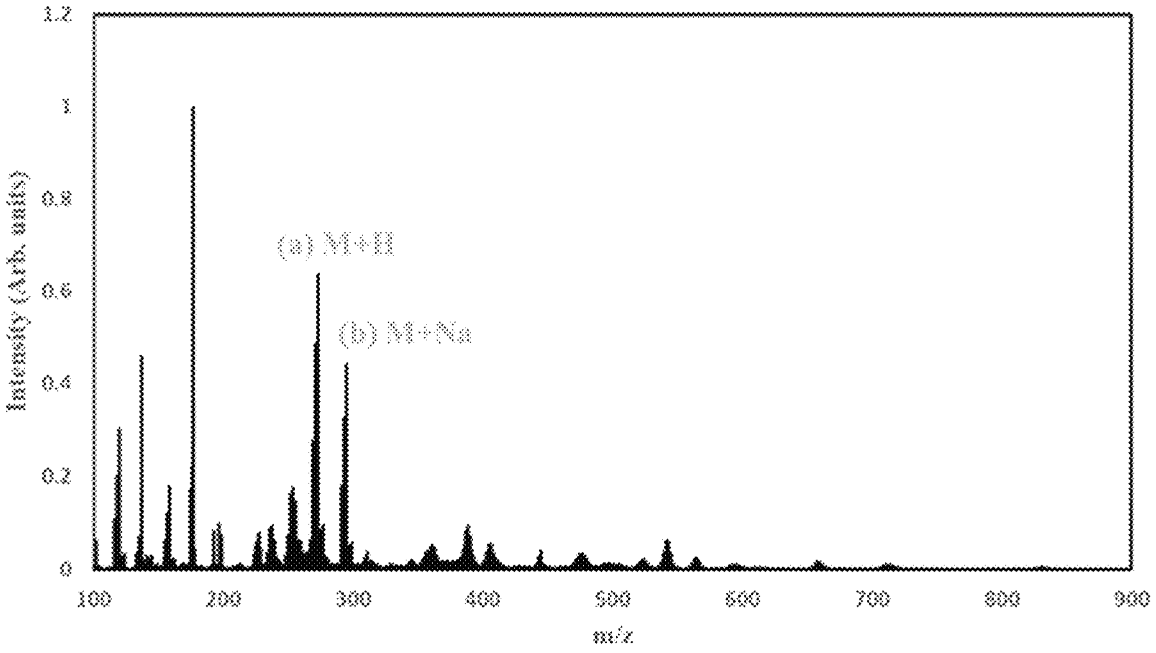
FIG. 3 shows results of analysis of tin compound 1 obtained in Example 1 with a maldi-tof mass spectrometer (MALDI-TOF MS).
Figure 4:
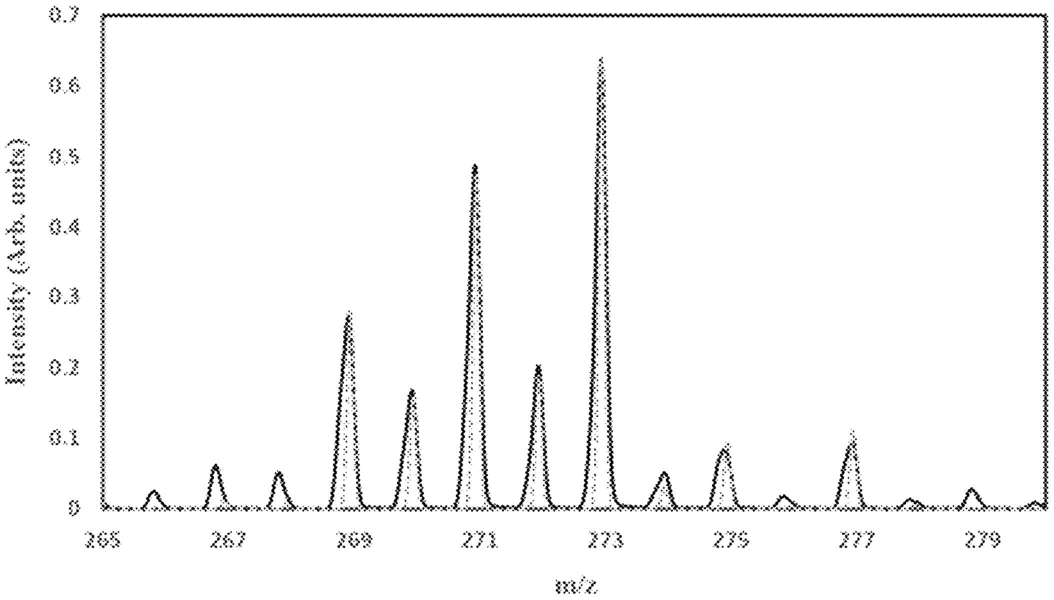
FIG. 4 shows results of estimating a molecular formula by isotope distribution simulation calculation of a peak corresponding to (a) of FIG. 3.
Figure 5:
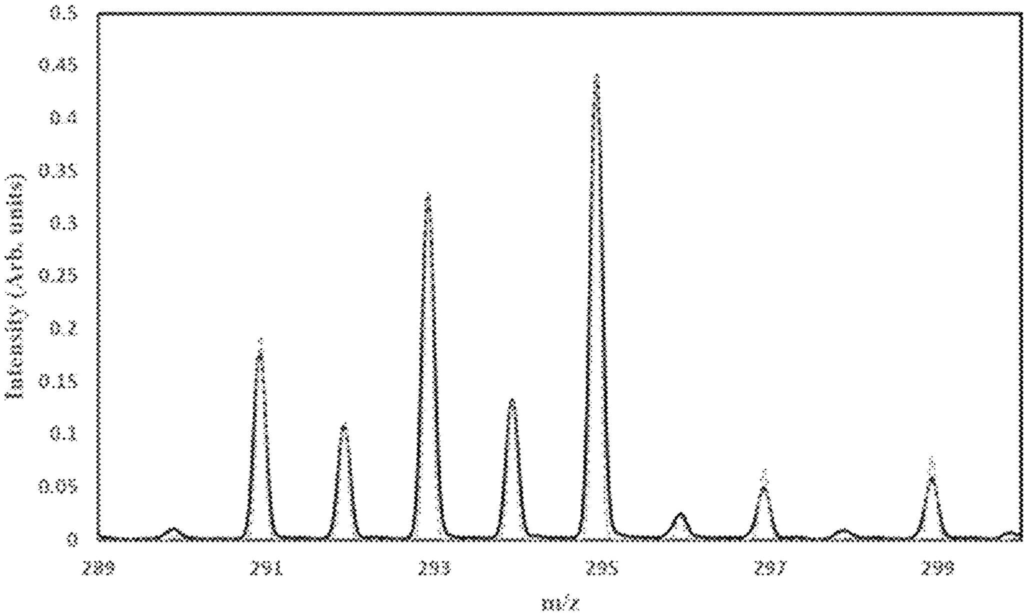
FIG. 5 shows results of estimating a molecular formula by isotope distribution simulation calculation of a peak corresponding to (b) of FIG. 3.

In order to analyze the structure of the obtained tin compound, a MALDI-TOF mass spectrometer (MS) was used, and tin compound 1 was dissolved at 1 wt % in methanol to prepare a solution, which was filtered through a 5 ml PTFE syringe filter and used for analysis. The analysis result graph is shown in FIG. 3, the results of estimating a molecular formula by isotope distribution simulation calculation of the peak corresponding to (a) in FIG. 3 are shown in FIG. 4, and the results corresponding to (b) are shown in FIG. 5. Referring to FIG. 4, it was confirmed that when a molecular formula of $[SnO_2(CH_3COOH)_2+H]^+$ was substituted in mass distributed near 272.929 Da, the isotope distribution graph matched. In addition, referring to FIG. 5, it was confirmed that when a molecular formula of $[SnO_2(CH_3COOH)_2+Na]^+$ was substituted in mass distributed near 294.944 Da, the isotope distribution graph matched. A solid line is a data obtained by MALDI-TOF analysis results, and a dotted line is a data obtained by simulation calculation.

Figure 6:
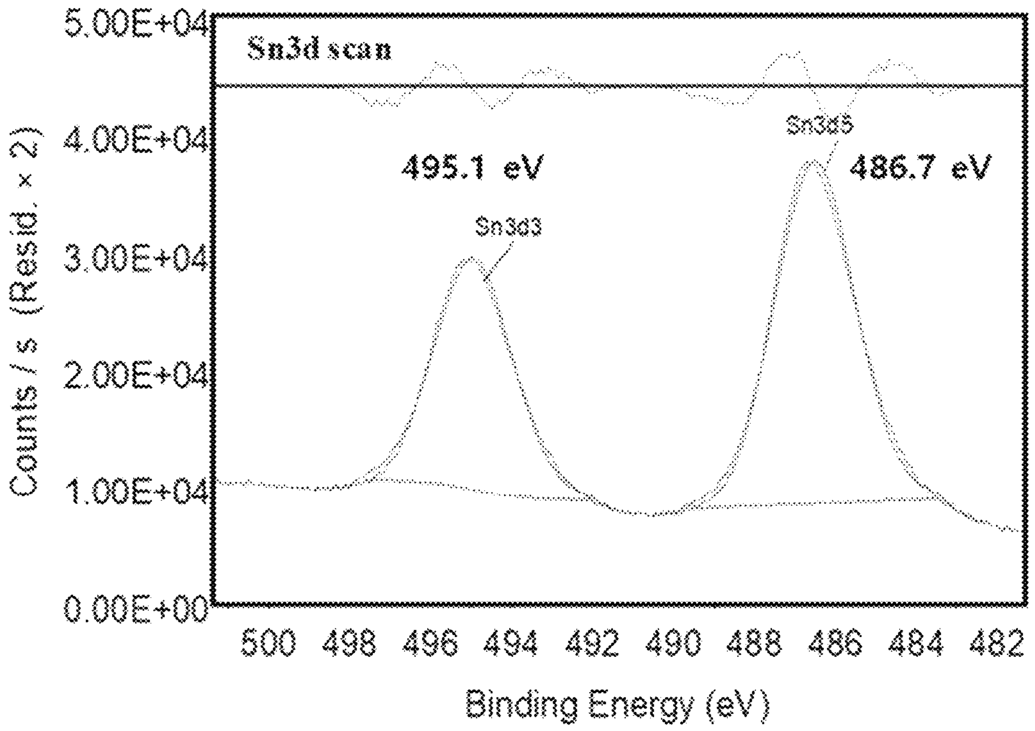
FIG. 6 shows analysis results of photoelectron spectroscopy (XPS) of tin compound 1 obtained in Example 1.

In addition, the obtained tin compound was analyzed in a solid powder state by X-ray photoelectron spectroscopy (XPS), and the results are shown in FIG. 6. Referring to FIG. 6, the peak of Sn3d3 was observed at 486.7 eV and the peak of Sn3d5 was observed at 495.1 eV, and it was confirmed therefrom that the tin atom of obtained tin compound 1 had an oxidation number of 4.

[Example 2] Preparation of Tin Compound 2

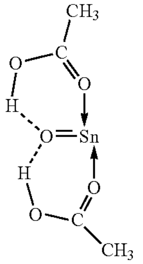

Tin compound 2 (acetic acid stabilized tin monoxide) was obtained in the same manner as in Example 1, except that 0.608 g of tin oxide powder was used, stirring was performed at room temperature for 30 minutes, and stirring was performed with heating for 1 hour.

Figure 7:
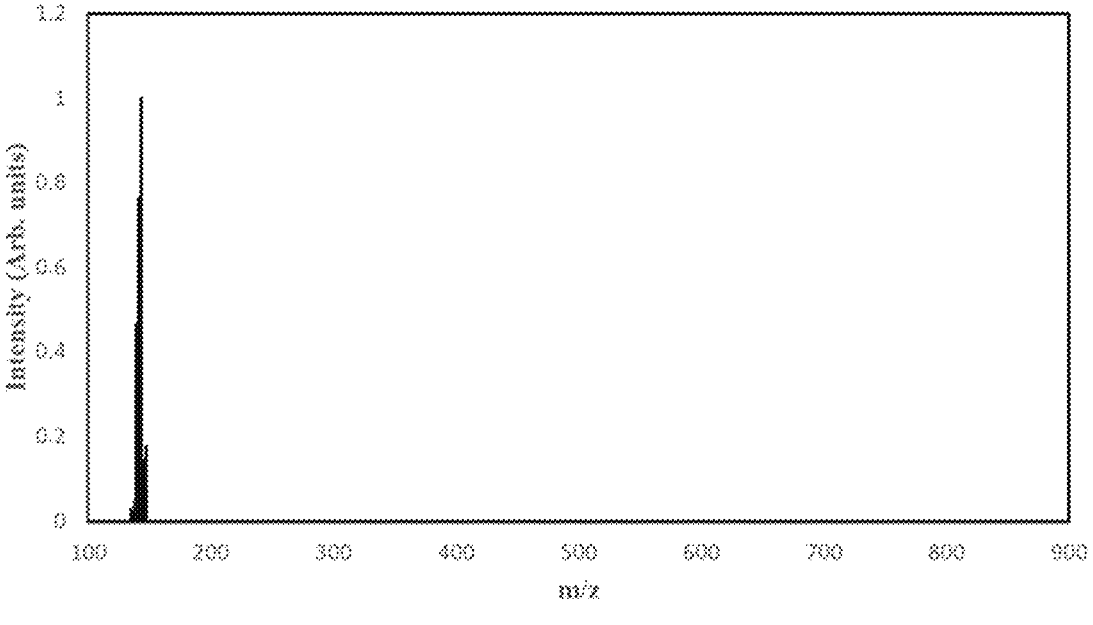
FIG. 7 shows FD-MS analysis results of tin compound 2 obtained in Example 2.
Figure 8:
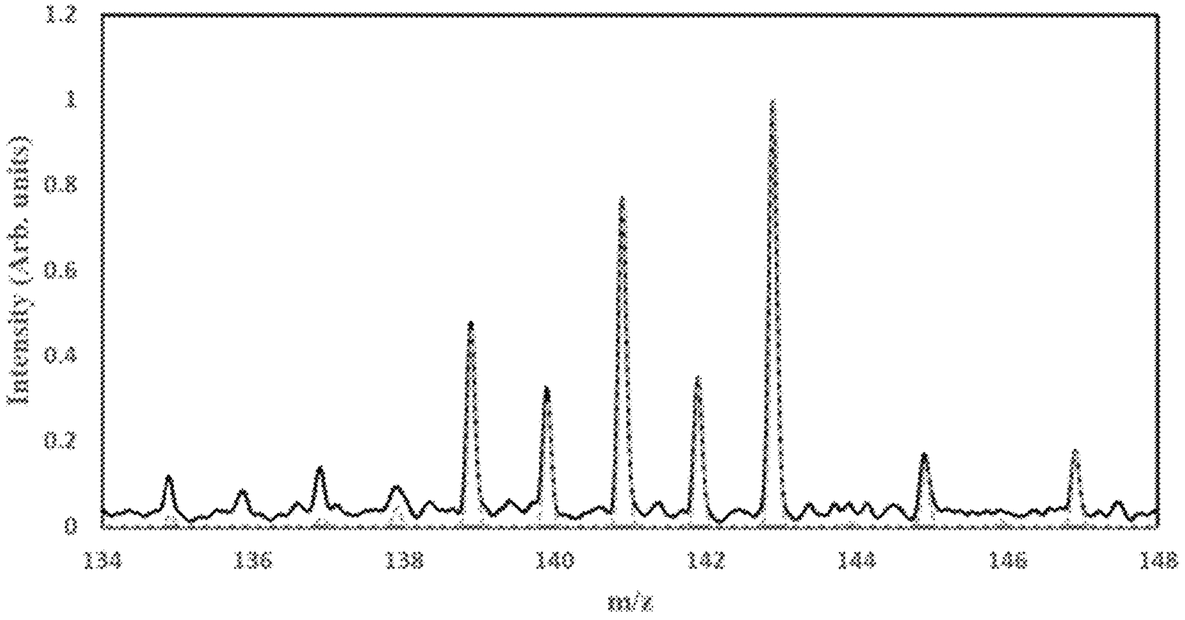
FIG. 8 shows results of estimating a molecular formula by isotope distribution simulation calculation of a peak corresponding to (b) of FIG. 7.

In order to analyze the structure of the obtained tin compound, Field Desorption-Mass Spectrometry (FD-MS) analysis was performed, and tin compound 2 was dissolved at 2 wt % in acetic acid to prepare a solution, which was filtered through a 5 ml PTFE syringe filter and used for analysis. The analysis results are shown in FIG. 7, and the results of estimating the molecular formula by isotope distribution simulation calculation are shown in FIG. 8. Referring to FIG. 8, it was confirmed that when a molecular formula of $[SnOLi]^+$ was substituted in mass distributed near 142.91 Da, the isotope distribution graph matched. Li is expected to be derived from promotor LiI used in acetic acid synthesis. A black solid line is FD-MS analysis results, and a red dotted line is a data obtained by simulation calculation.

Figure 9:
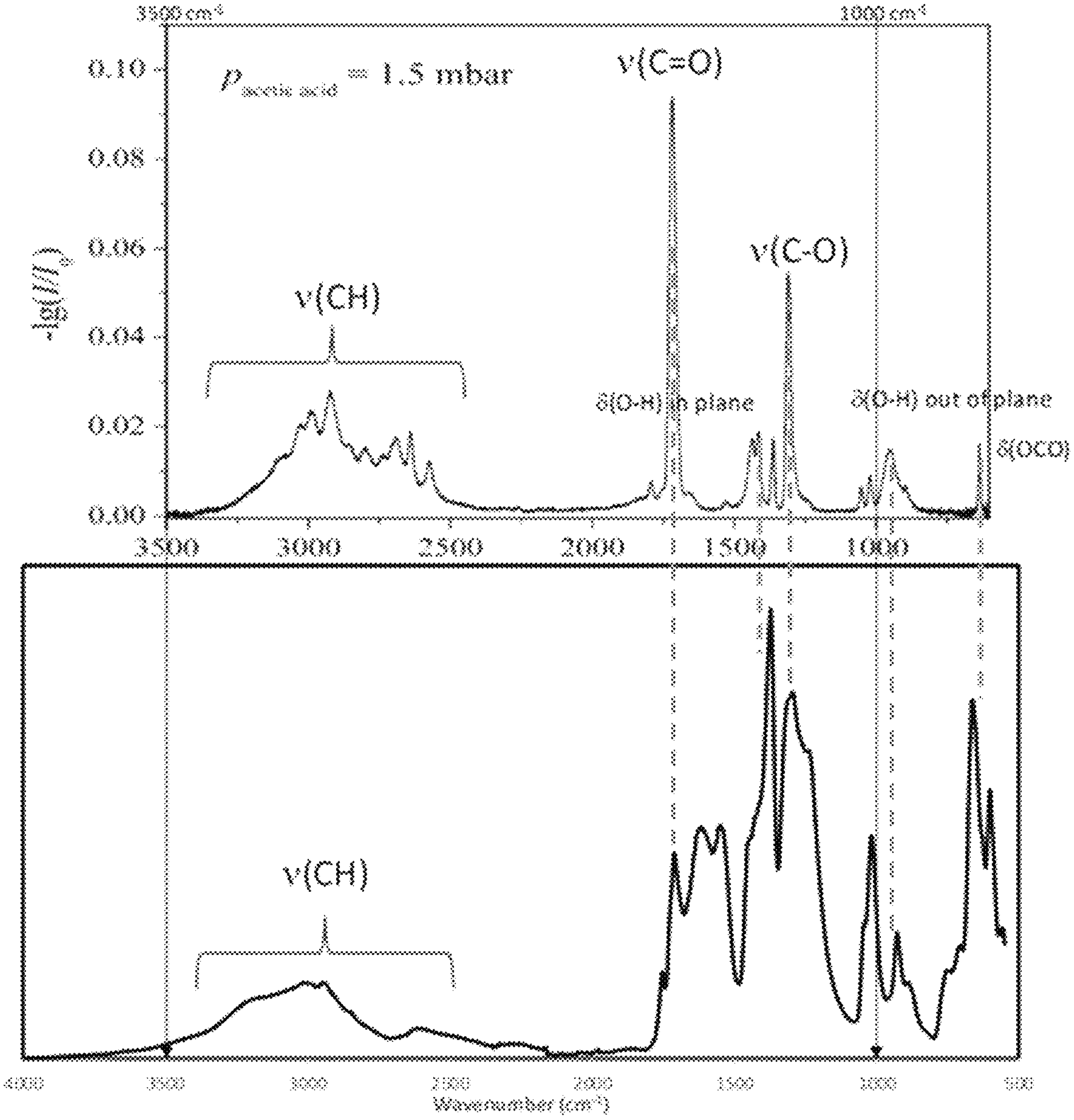
FIG. 9 shows results of FT-IR spectroscopy analysis of tin compound 2 obtained in Example 2.

In addition, the results of analyzing the obtained tin compound in a solid powder state by FT-IR spectroscopy are shown in FIG. 9. In FIG. 9, the presence of C═O was confirmed from the peak at 1710 $cm^{-1}$, and it was confirmed therefrom that acetic acid was present without being completely removed from tin compound 2.

[Example 3] Preparation of Tin Compounds 3-1 and 3-2

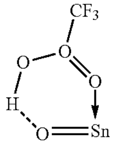

3-1

+

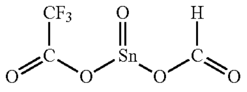

3-2

Tin compounds 3-1 and 3-2 were obtained in the same manner as in Example 2, except that trifluoroacetic acid was used instead of acetic acid.

Figure 10:
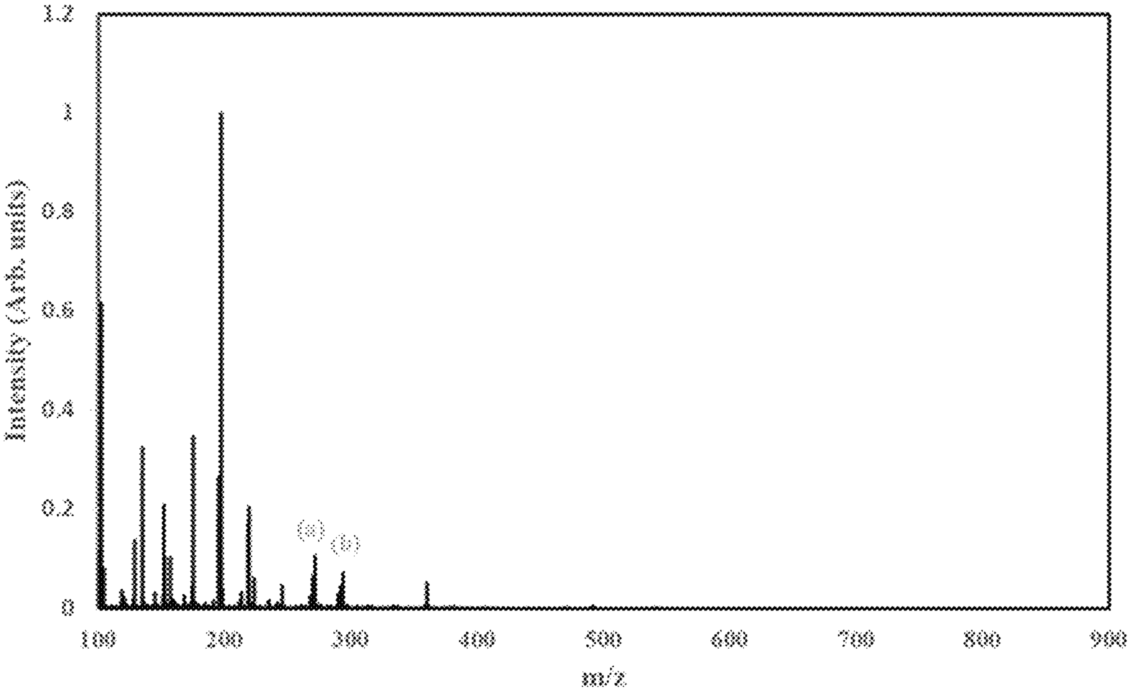
FIG. 10 shows analysis results of tin compounds 3-1 and 3-2 obtained in Example 3 with a maldi-tof mass spectrometer (MALDI-TOF MS).

In order to analyze the structure of the obtained tin compound, a MALDITOF mass spectrometer (MS) was used, and tin compounds 3-1 and 3-2 were dissolved at 1 wt % in methanol to prepare a solution, which was filtered through a 5 ml PTFE syringe filter and used for analysis. The analysis result graph is shown in FIG. 10, the results of estimating a molecular formula by isotope distribution simulation calculation of the peak corresponding to (a) in FIG. 10 are shown in FIG. 11, and the results corresponding to (b) are shown in FIG. 12.

Figure 11:
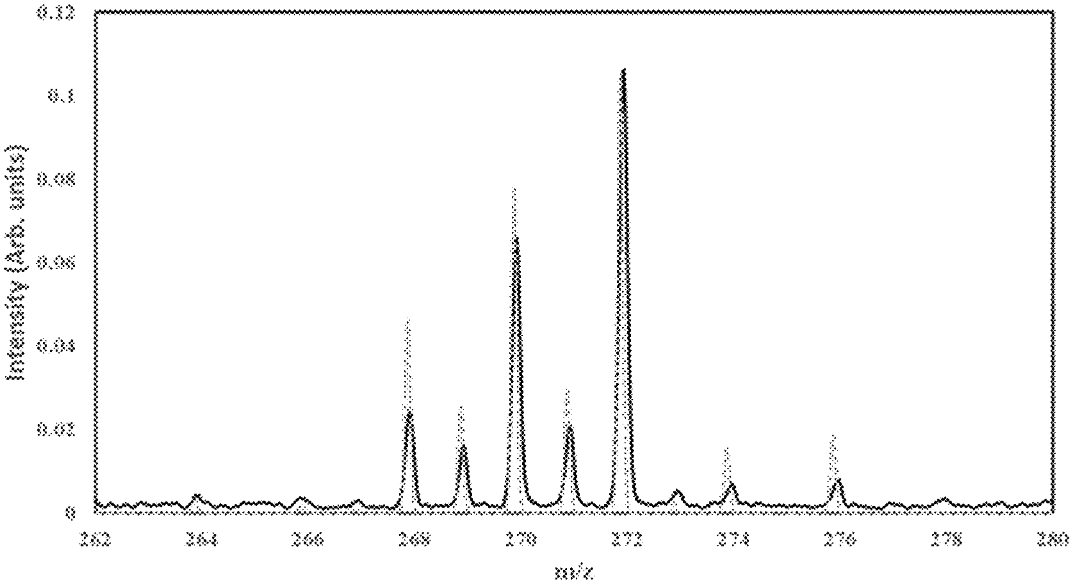
FIG. 11 shows results of estimating a molecular formula by isotope distribution simulation calculation of a peak corresponding to (a) of FIG. 10.

Referring to FIG. 11, it was confirmed that when a molecular formula of $[SnO(CF_3COOH)+Na]^+$ was substituted in mass distributed near 271.93 Da, the isotope distribution graph matched, and a compound corresponding to tin compound 3-1 was prepared.

Figure 12:
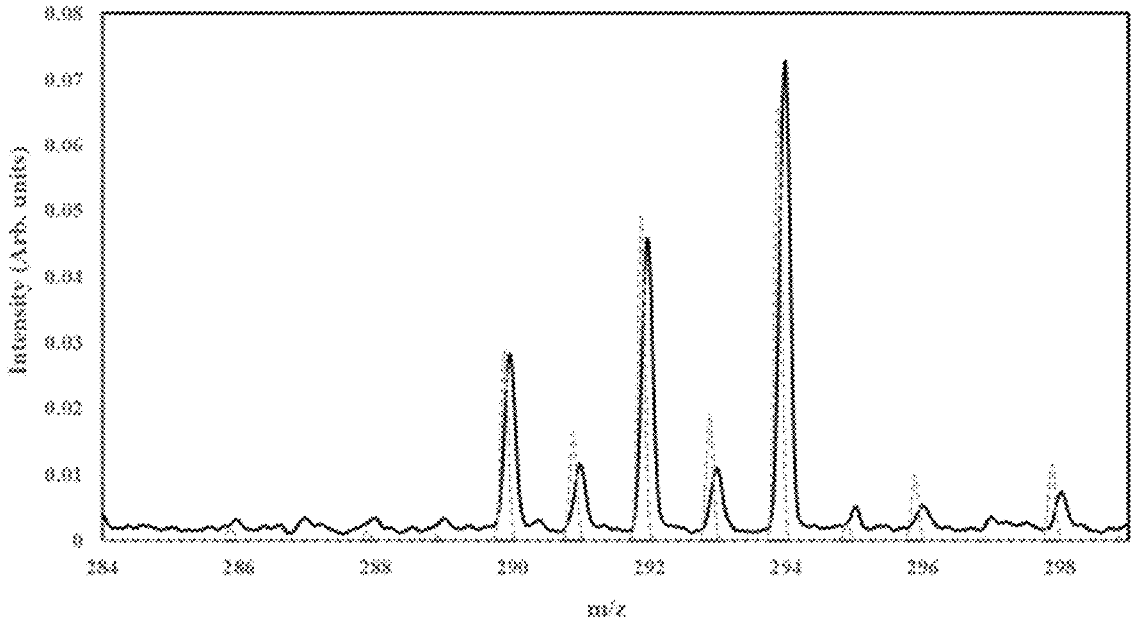
FIG. 12 shows results of estimating a molecular formula by isotope distribution simulation calculation of a peak corresponding to (b) of FIG. 10.

In addition, referring to FIG. 12, it was confirmed that when a molecular formula of $SnO(CF_3COO)(HCOO)$ was substituted in mass distributed near 293.98 Da, the isotope distribution graph was method, and a compound corresponding to tin compound 3-2 was prepared. A solid line is a data obtained by MALDI-TOF analysis results, and a dotted line is a data obtained by simulation calculation.

[Examples 4 to 8] Preparation of Photoresist Composition

The tin compounds obtained in Examples 1 to 3 were dissolved in a solvent to prepare photoresist compositions. The contents of the tin compounds and the type of solvent are shown in the following Table 1.

TABLE 1

| | Tin compound | Content | Solvent |
|---|---|---|---|
| Example 4 | Example 1 | 2 wt % | Ethyl lactate |
| Example 5 | Example 2 | 2 wt % | Ethyl lactate |
| Example 6 | Example 2 | 2 wt % | Acetic acid |
| Example 7 | Example 3 | 1 wt % | Methanol |
| Example 8 | Example 3 | 1 wt % | Water |

Figure 13:
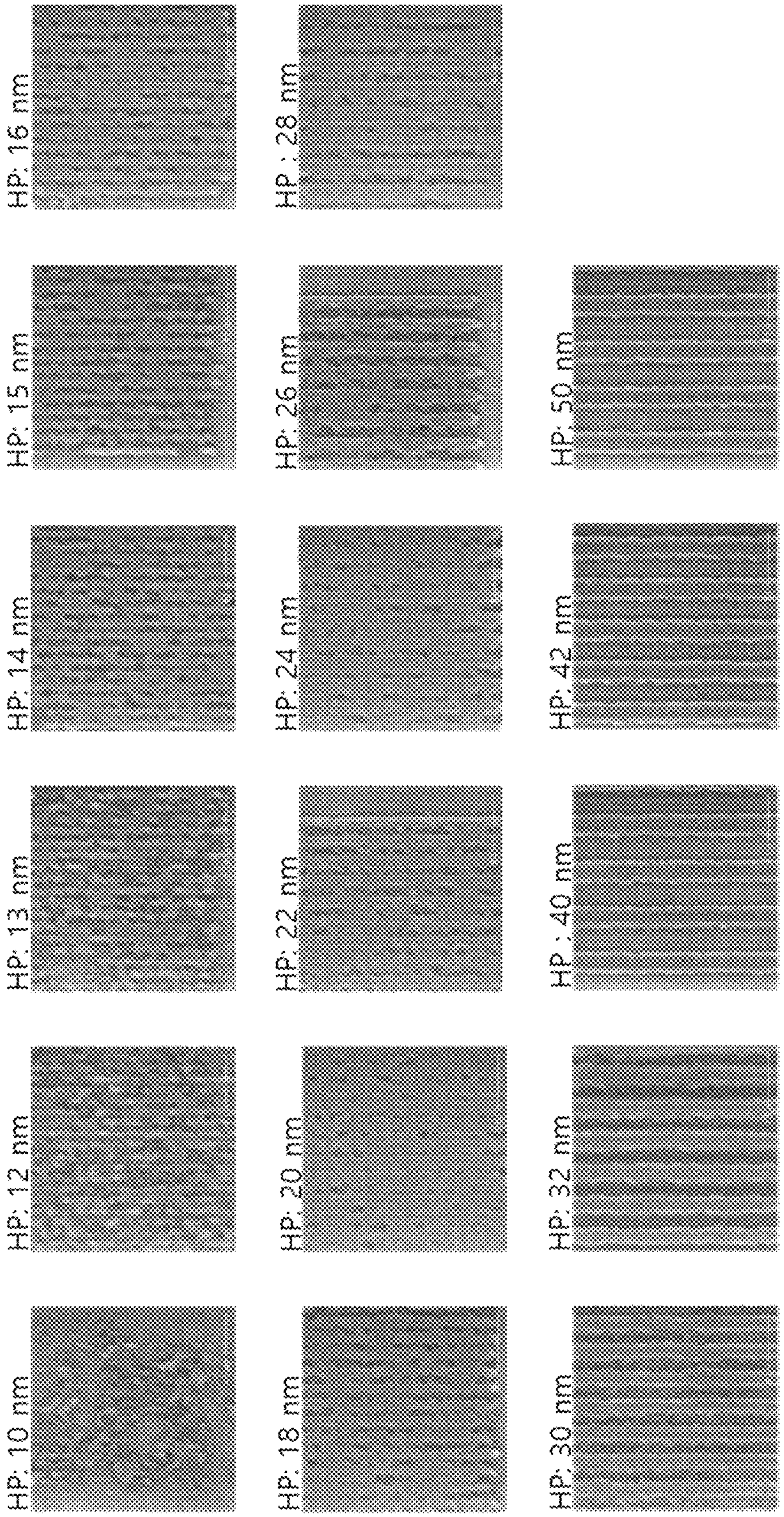
FIG. 13 shows results of observing a pattern irradiated with a light exposure amount of 130 mJ/cm$^2$ with CD-SEM in Example 9.
Figure 14:
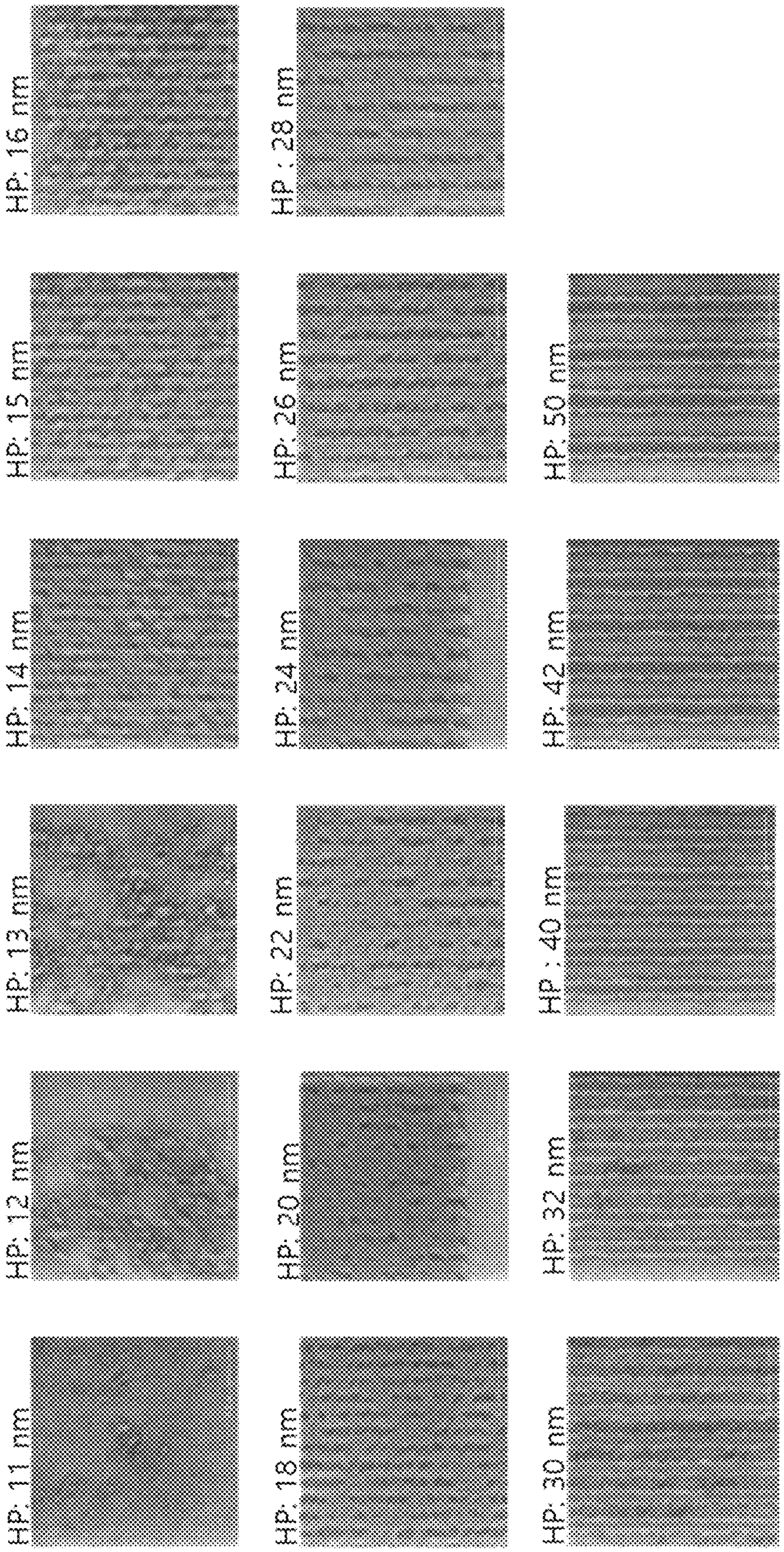
FIG. 14 shows results of observing a pattern irradiated with a light exposure amount of 120 mJ/cm$^2$ with CD-SEM in Example 9.
Figure 15:
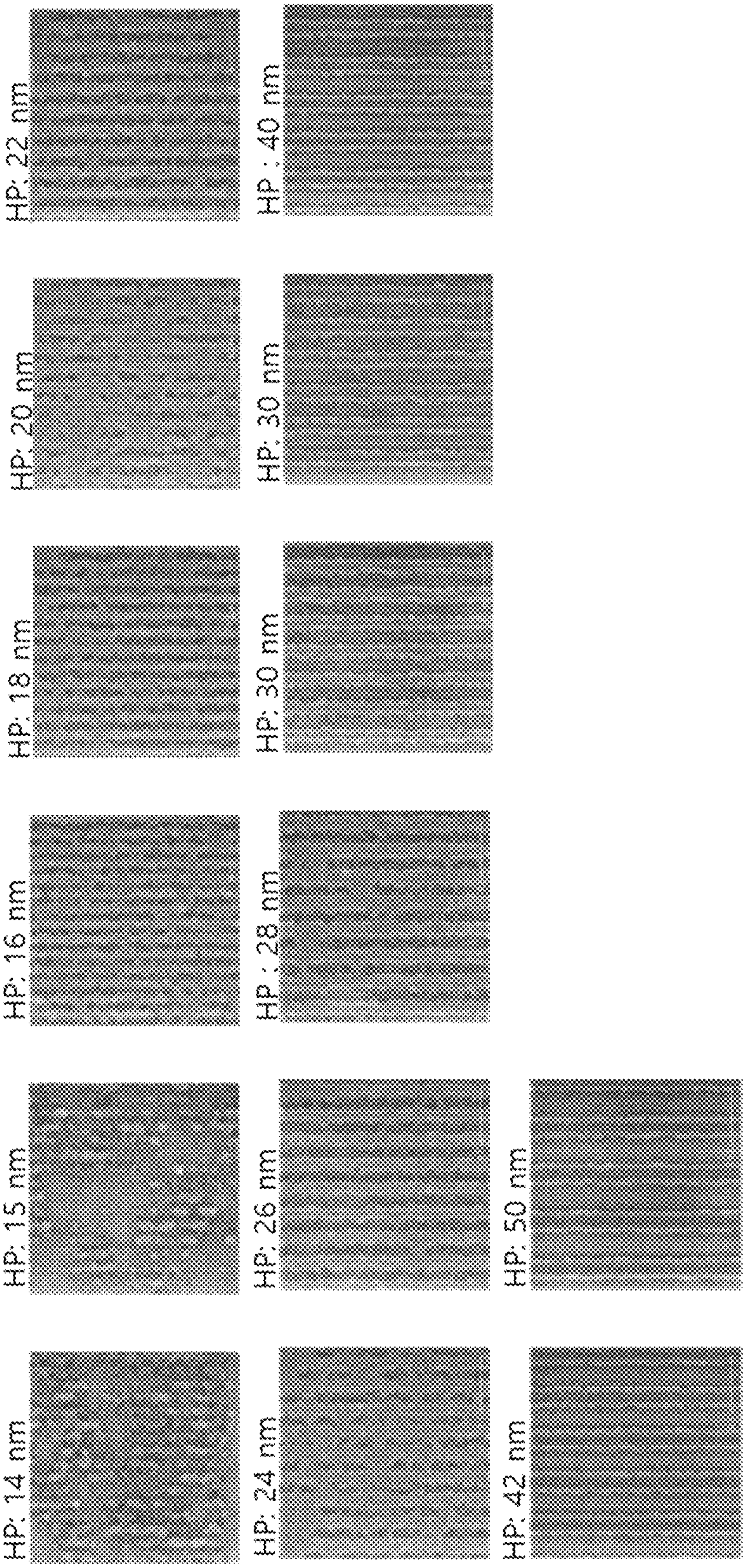
FIG. 15 shows results of observing a pattern irradiated with a light exposure amount of 110 mJ/cm$^2$ with CD-SEM in Example 9.
Figure 16:
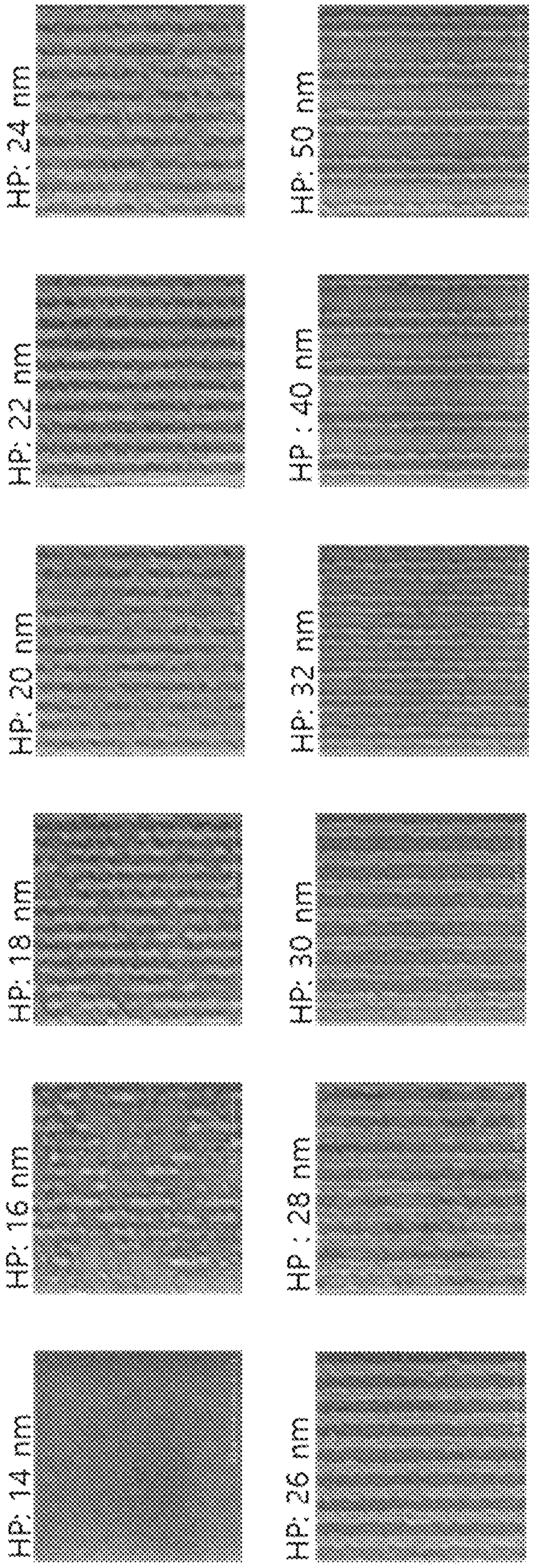
FIG. 16 shows results of observing a pattern irradiated with a light exposure amount of 100 mJ/cm$^2$ with CD-SEM in Example 9.
Figure 17:
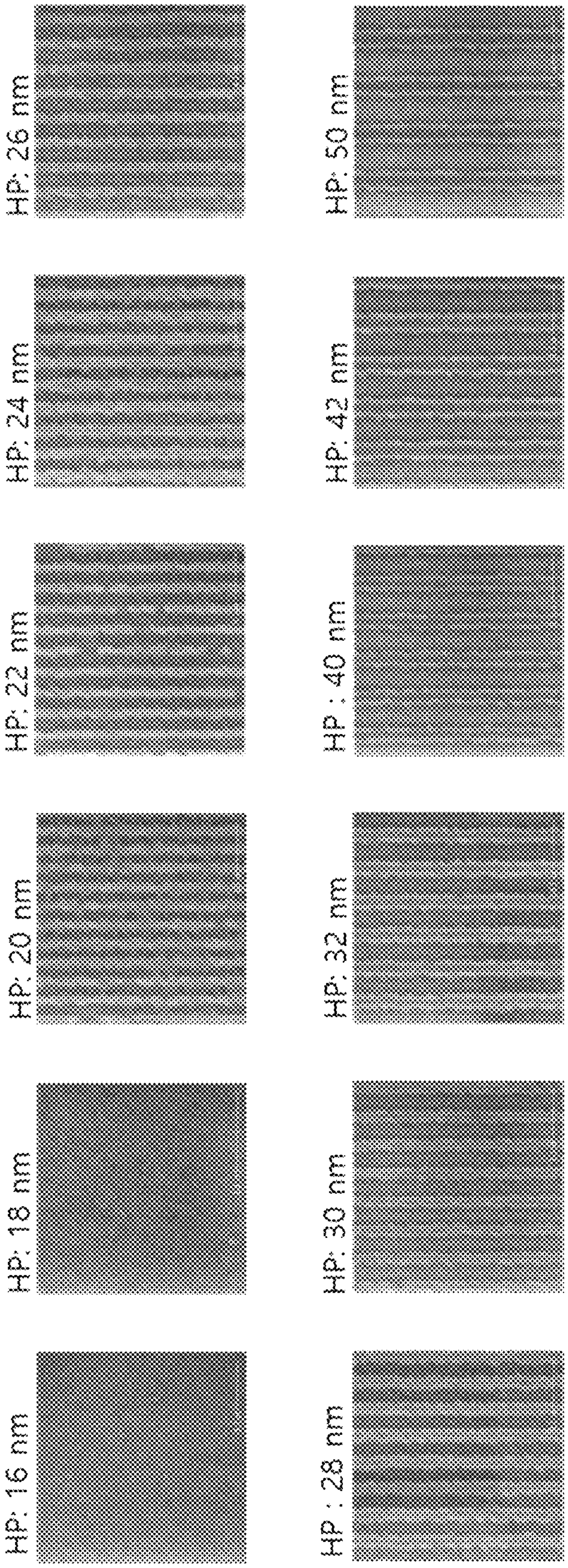
FIG. 17 shows results of observing a pattern irradiated with a light exposure amount of 90 mJ/cm$^2$ with CD-SEM in Example 9.
Figure 18:
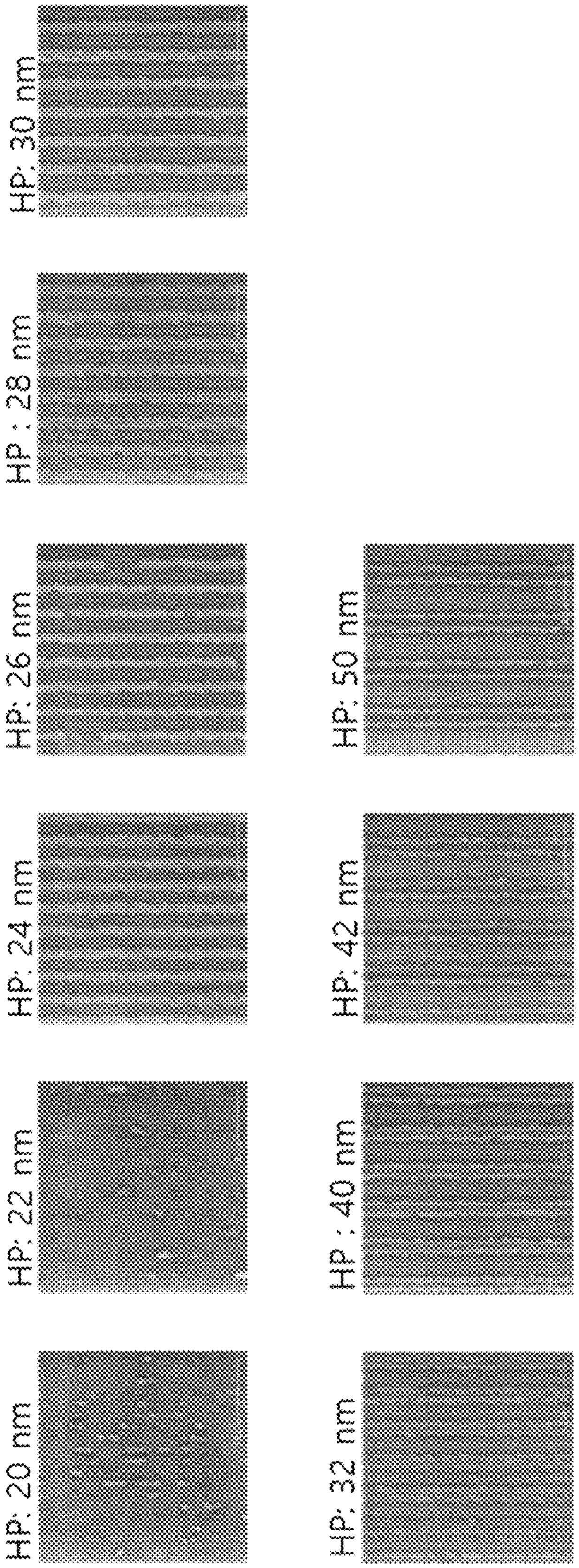
FIG. 18 shows results of observing a pattern irradiated with a light exposure amount of 80 mJ/cm$^2$ with CD-SEM in Example 9.
Figure 19:
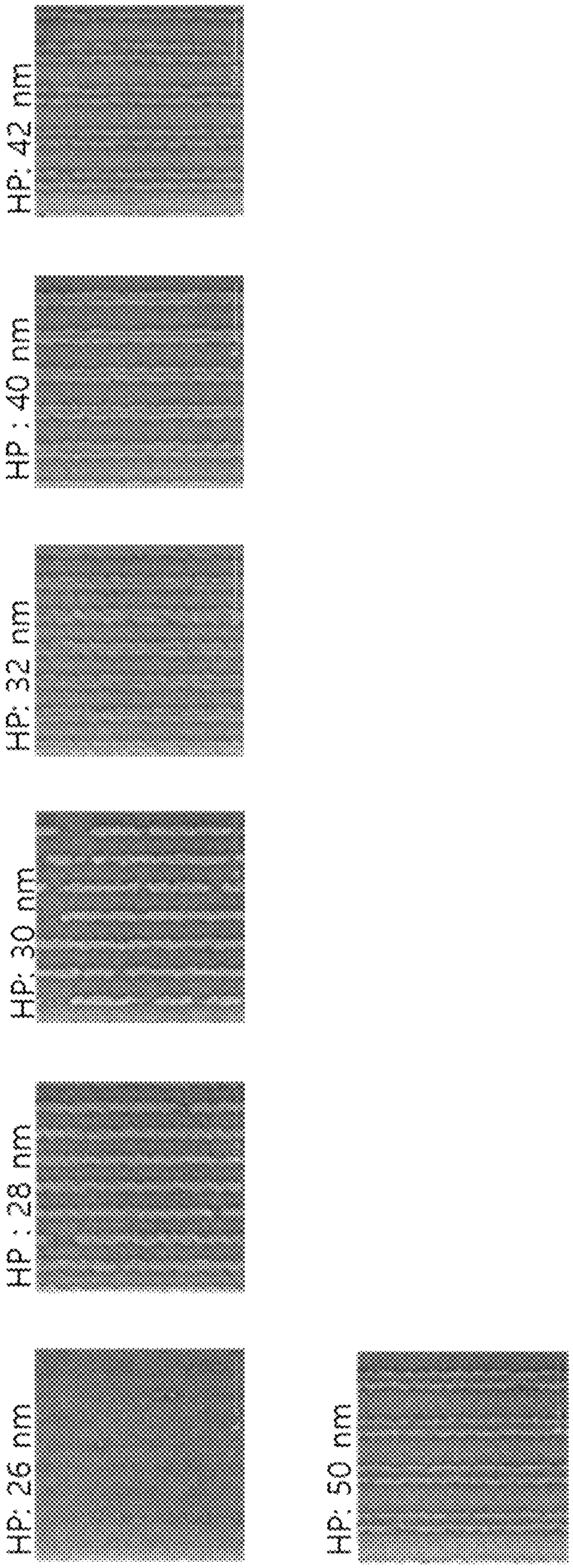
FIG. 19 shows results of observing a pattern irradiated with a light exposure amount of 70 mJ/cm$^2$ with CD-SEM in Example 9.
Figure 20:
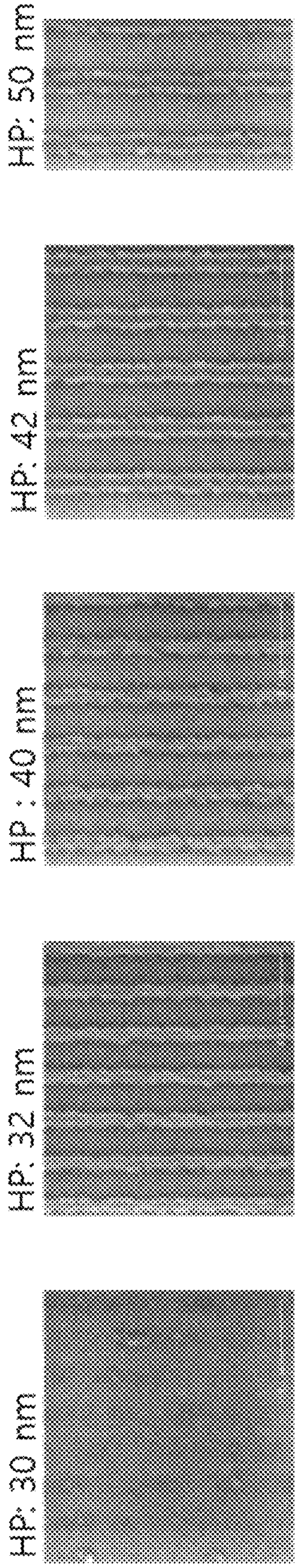
FIG. 20 shows results of observing a pattern irradiated with a light exposure amount of 60 mJ/cm$^2$ with CD-SEM in Example 9.
Figure 21:
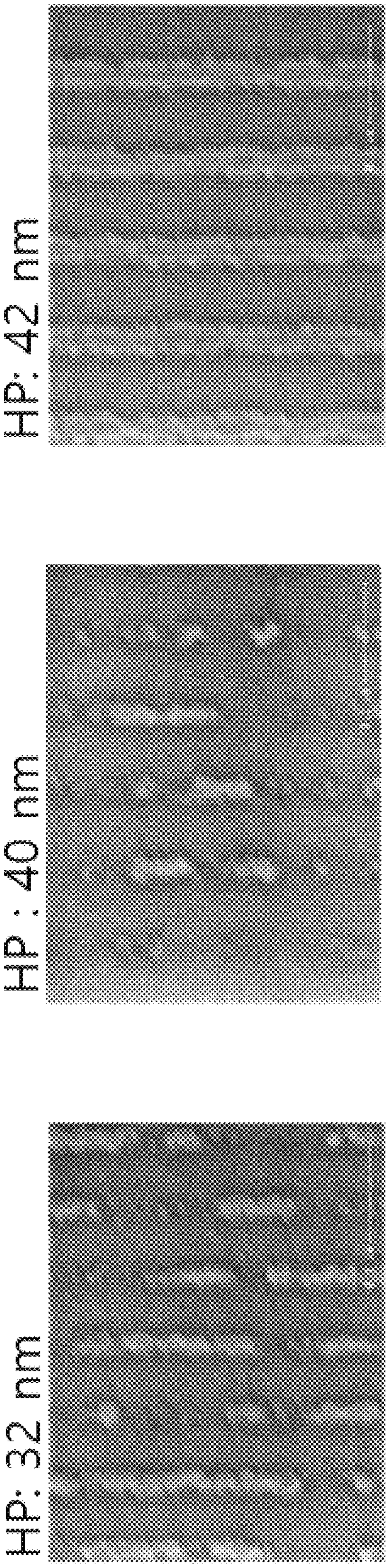
FIG. 21 shows results of observing a pattern irradiated with a light exposure amount of 50 mJ/$cm^2$ with CD-SEM in Example 9.

[Example 9] Formation of Photoresist Pattern Using Extreme Ultraviolet (EUV) Rays A p-Si silicon wafer on which a thermal oxidation film ($SiO_2$) was deposited at a thickness of 100 nm was cut into a size of 1.5 cm×1.5 cm and washed with sonication with acetone for 20 minutes. The photoresist composition prepared in Example 4 was applied on the wafer, spin-coated (1500 rpm, 30 s) to manufacture a thin film, and heated at 90° C. for 1 minute to remove the solvent. The manufactured thin film was irradiated with extreme ultraviolet (EUV) rays in a light exposure amount of 30 to 130 $mJ/cm^2$. Thereafter, PEB was performed by heating at 90° C. for 1 minute, and development for 10 seconds was performed by immersion in a developing solution of 2.38 wt % tetramethylammonium hydroxide (TMAH) to obtain a pattern. The results were observed with critical dimension scanning electron microscope (CD-SEM), a pattern irradiated with a light exposure amount of 130 $mJ/cm^2$ is shown in FIG. 13, a pattern irradiated with a light exposure amount of 120 $mJ/cm^2$ is shown in FIG. 14, a pattern irradiated with a light exposure amount of 110 $mJ/cm^2$ is shown in FIG. 15, a pattern irradiated with a light exposure amount of 100 $mJ/cm^2$ is shown in FIG. 16, a pattern irradiated with a light exposure amount of 90 $mJ/cm^2$ is shown in FIG. 17, a pattern irradiated with a light exposure amount of 80 $mJ/cm^2$ is shown in FIG. 18, a pattern irradiated with a light exposure amount of 70 $mJ/cm^2$ is shown in FIG. 19, a pattern irradiated with a light exposure amount of 60 $mJ/cm^2$ is shown in FIG. 20, a pattern irradiated with a light exposure amount of 50 $mJ/cm^2$ is shown in FIG. 21, and a pattern irradiated with a light exposure amount of 40 $mJ/cm^2$ is shown in FIG. 22. Thus, it was confirmed that the photoresist composition comprising the tin compound according to the present disclosure may stably form a high-quality ultra-fine pattern even with a small light exposure amount.

[Example 10] Formation of Photoresist Pattern Using Electron Beam

Figure 23:
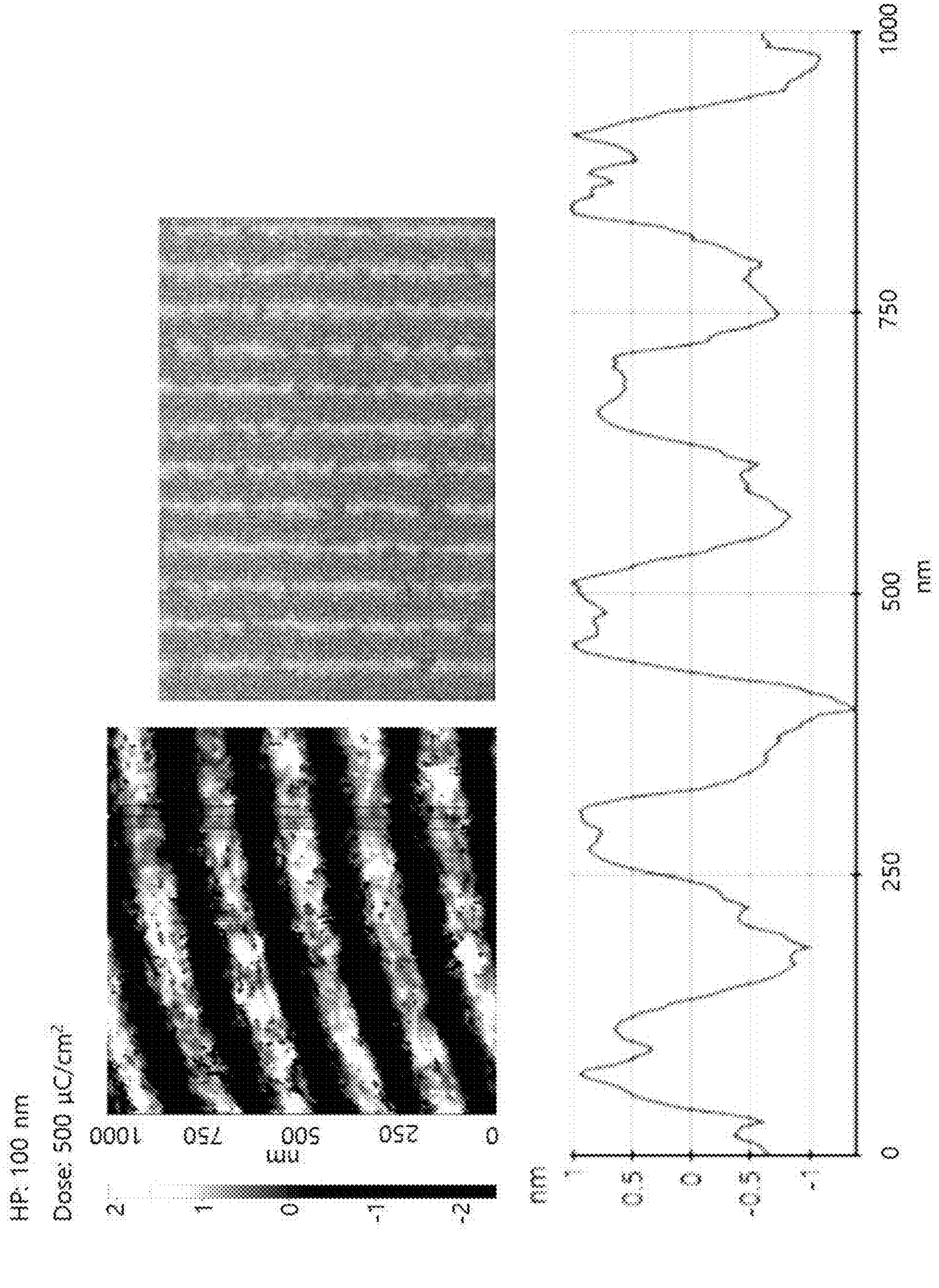
FIG. 23 shows results of observing a pattern of a light exposure amount of 500 μC/$cm^2$ with FE-SEM and an atomic force microscope (AFM) in Example 10.

A p-Si silicon wafer on which a thermal oxidation film ($SiO_2$) was deposited at a thickness of 100 nm was cut into a size of 1.5 cm×1.5 cm and washed with sonication with acetone for 20 minutes. The photoresist composition prepared in Example 5 was applied on the wafer, spin-coated (3000 rpm, 30 s) to manufacture a thin film, and heated at 50° C. for 1 minute to remove the solvent. The manufactured thin film was irradiated with electron beam in a light exposure amount of 200 to 5000 $\mu C/cm^2$. Thereafter, development for 10 seconds was performed by immersion in a developing solution of 2.38 wt % tetramethylammonium hydroxide (TMAH) to obtain a pattern. The results were observed with an atomic force microscope (AFM) and a field emission scanning electron microscope (FE-SEM) and are shown in FIG. 23. After development with the atomic force microscope (AFM), the remaining thicknesses of an exposed area and a non-exposed area were analyzed, and it was confirmed therefrom that an ultra-fine pattern was stably formed in a light exposure amount of 500 $\mu C/cm^2$.

[Experimental Example 1] Measurement of Non-Dissolution (ND) Temperature

A p-Si silicon wafer on which a thermal oxidation film ($SiO_2$) was deposited at a thickness of 100 nm was cut into a size of 1.5 cm×1.5 cm and washed with sonication with acetone for 20 minutes. The photoresist compositions prepared in Examples 4 to 8 were applied on the wafer and spin-coated (1500-3000 rpm, 30 s) to manufacture a thin film, and then it was observed whether the thin film was dissolved in the developing solution while changing the temperature. A 2.38 wt % of tetramethylammonium hydroxide (TMAH) solution was used as the developing solution, and a temperature at which the thin film was not dissolved in the developing solution any more during heating was defined as a non-dissolution (ND) temperature. The analysis results are shown in the following Table 2. A maximum temperature which was applicable to the PAB and PEB processes of the photoresist composition according to the present disclosure was confirmed therefrom, and it was found that the photoresist composition according to the present disclosure had excellent thermal stability and formed a high-quality photoresist pattern without breaking the pattern at a high temperature.

TABLE 2

| Composition | ND temperature |
|---|---|
| Example 4 | 230° C. |
| Example 5 | 230° C. |
| Example 6 | 125° C. |
| Example 7 | 125° C. |
| Example 8 | 110° C. |

[Experimental Example 2] Measurement of Electron Beam Sensitivity

Electron beam sensitivity was measured using the photoresist compositions prepared in Examples 5 to 7.

Figure 24:
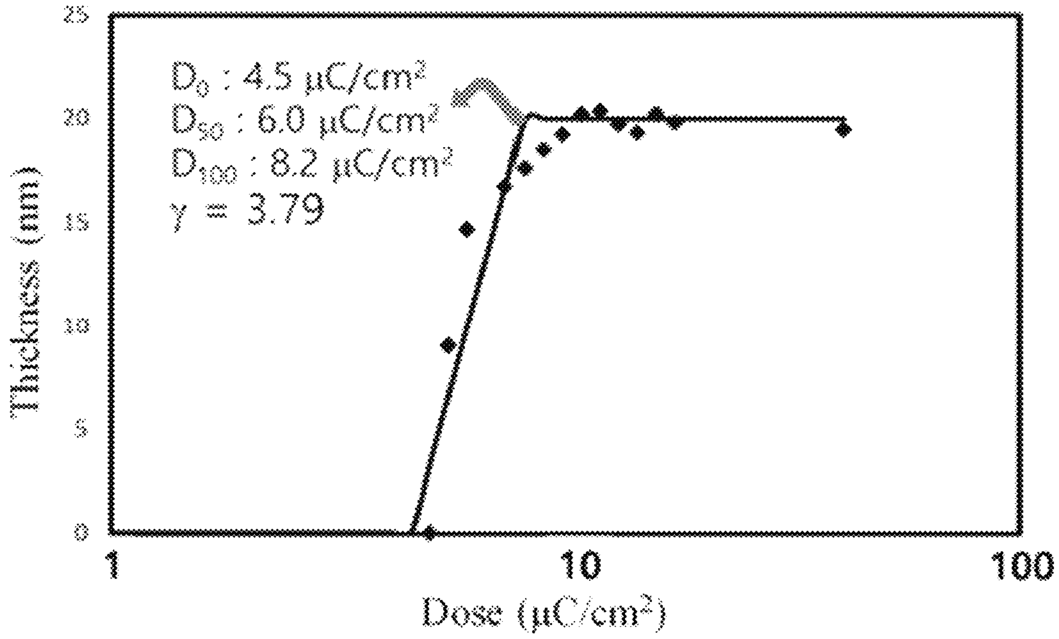
FIGS. 24 to 26 show results of measuring thickness remaining depending on a light exposure amount of a photoresist pattern obtained in Experimental Example 2 with AFM.
Figure 25:
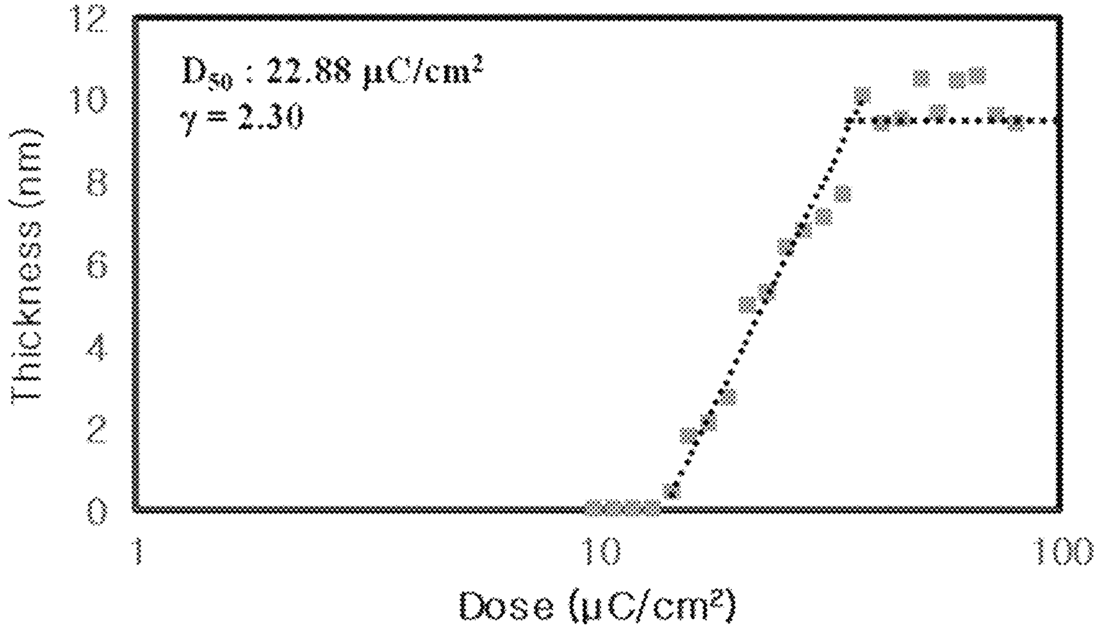
Figure 26:
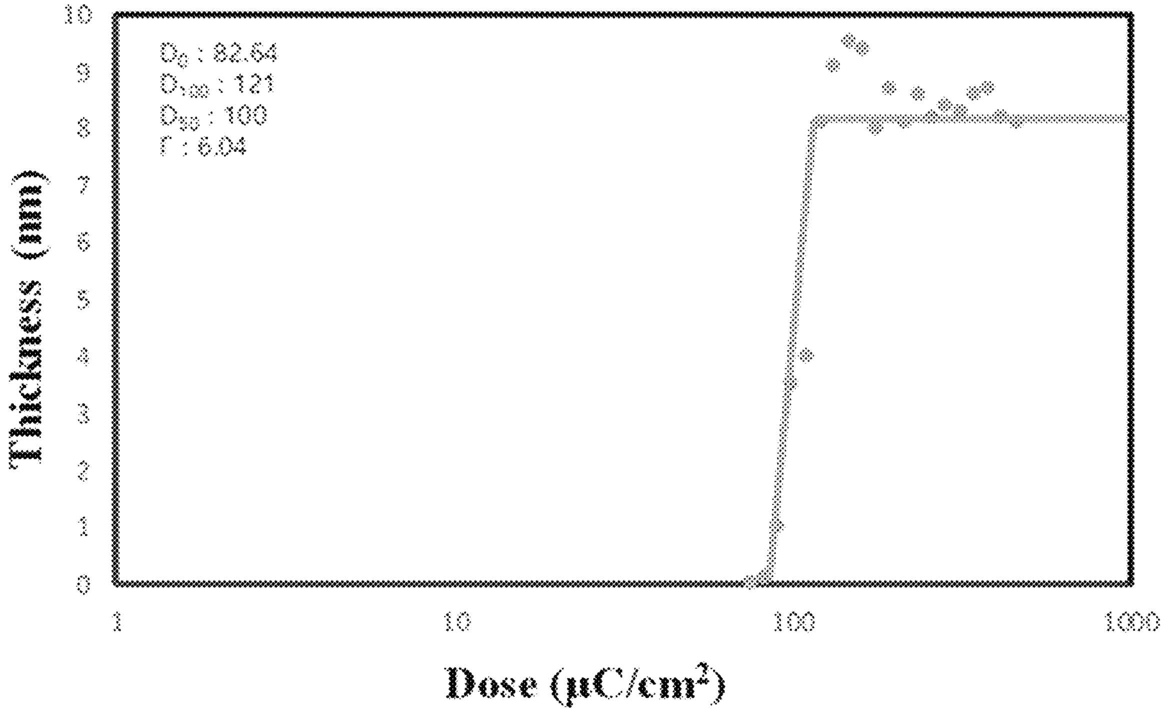

A p-Si silicon wafer on which a thermal oxidation film ($SiO_2$) was deposited at a thickness of 100 nm was cut into a size of 1.5 cm×1.5 cm and washed with sonication with acetone for 20 minutes. The photoresist compositions prepared in Examples 5 to 7 were applied on the wafer and spin-coated (3000 rpm, 30 s) to manufacture a thin film, and then a PAB process was performed. The manufactured thin film was irradiated with electron beam in a light exposure amount of 1 to 1000 $\mu C/cm^2$. Thereafter, development for 10 seconds was performed by immersion in a developing solution of 2.38 wt % tetramethylammonium hydroxide (TMAH) to obtain a pattern. The used composition and the process conditions are shown in the following Table 3. The thickness of the obtained pattern was measured with an atomic force microscope (AFM) and is shown in FIGS. 24 to 26, and $D_{50}$ refers to a light exposure amount when the remaining thickness of the thin film was half and $D_{100}$ refers to a light exposure amount when the remaining thickness of the thin film was maximum. In addition, the thickness of the thin film was calculated as an average of the thicknesses of the thin film remaining after light exposure depending on the light exposure amount.

TABLE 3

| Composition | PAB process |
|---|---|
| Example 5 | 85° C., 1 minute |
| Example 6 | 85° C., 1 minute |
| Example 7 | 100° C., 1 minute |

FIG. 24 shows the thickness of the thin film remaining after developing the pattern obtained using the photoresist composition of Example 5. The measured values were $D_0$ of 4.5 $\mu C/cm^2$, $D_{50}$ of 6.0 $\mu C/cm^2$, and $D_{100}$ of 8.25 $\mu C/cm^2$, and a contrast γ which is a slope of a graph of the thin film thickness depending on the light exposure amount was confirmed to be 3.79.

FIG. 25 shows the thickness of the thin film remaining after developing the pattern obtained using the photoresist composition of Example 6. The measured value was $D_{50}$ of 22.88 $\mu C/cm^2$, and a contrast γ which is a slope of a graph of the thin film thickness depending on the light exposure amount was confirmed to be 2.30.

FIG. 26 shows the thickness of the thin film remaining after developing the pattern obtained using the photoresist composition of Example 7. The measured values were $D_0$ of 82.64 $\mu C/cm^2$, $D_{50}$ of 100 $\mu C/cm^2$, and $D_{100}$ of 121 $\mu C/cm^2$, and a contrast γ which is a slope of a graph of the thin film thickness depending on the light exposure amount was confirmed to be 6.04.

As seen from the above description, since the photoresist composition comprising the tin compound according to an example embodiment of the present disclosure may implement excellent light sensitivity and etch resistance simultaneously, a high-quality semiconductor device may be manufactured using the composition. In addition, since the pattern is produced in a development process by dissociating the organic ligand of the tin compound upon light exposure and polymerizing the tin molecules with each other by the addition reaction therebetween, a conventional problem of reduced pattern reproducibility due to an external environment such as moisture and carbon dioxide may be prevented.

Since the photoresist composition comprising the tin compound according to an example embodiment has excellent light sensitivity and etch resistance, the photoresist pattern using the same may be formed in a small thickness even in an ultra-fine pattern.

Since the tin compound according to an example embodiment is chemically stable and may be dissolved in an organic solvent well, it may be useful as a photoresist material of the photoresist composition.

In addition, the photoresist composition comprising the tin compound according to an example embodiment may prevent a problem of reproducibility reduced by an external environment such as moisture and carbon dioxide when forming a photoresist pattern.

In addition, since the photoresist composition comprising the tin compound according to an example embodiment may form a high-quality photoresist pattern without reaction with a gas molecule under a small light exposure amount, it is industrially very useful.

Hereinabove, although the present disclosure has been described by the specific matters and limited example embodiments in the present specification, they have been provided only for assisting the entire understanding of the present disclosure, and the present disclosure is not limited to the example embodiments, and various modifications and changes may be made by those skilled in the art to which the present disclosure pertains from the description.

What is claimed is:

1. A tin compound comprising:

a central skeleton comprising a tin-oxygen double bond;

an organic ligand bonded to the central skeleton;

wherein the organic ligand is any one or more selected from the group consisting of formic acid, C1-C10 alkyl carboxylic acid, C2-C10 alkenyl carboxylic acid, C3-C10 cycloalkyl carboxylic acid, C6-C20 aryl carboxylic acid, haloC1-C10 alkyl carboxylic acid, C1-C10 alkylcarbonyloxy, C2-C10 alkenylcarbonyloxy, C3-C10 cycloalkylcarbonyloxy, C6-C20 arylcarbonyloxy, haloC1-C10 alkylcarbonyloxy, C1-C10 alkylcarbonylamine, and haloC1-C10 alkylcarbonylamine, wherein the central skeleton is tin dioxide (O═Sn═O) or tin monoxide (O═Sn), and wherein the tin compound is represented by any one of the following Chemical Formulae 1 to 4:

[Chemical Formula 1]

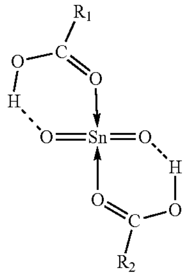

[Chemical Formula 2]

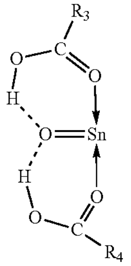

[Chemical Formula 3]

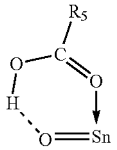

[Chemical Formula 4]

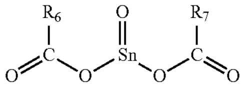

wherein $R_1$ to $R_{75}$ are independently of one another hydrogen, C1-C10 alkyl, or haloC1-C10 alkyl, and $R_6$ and $R_7$ are independently of one another hydrogen or haloC1-C5 alkyl.

2. The tin compound of claim 1, wherein $R_1$ to $R_4$ are independently of one another C1-C5 alkyl or haloC1-C5 alkyl; and $R_5$ is hydrogen, C1-C5 alkyl, or haloC1-C5 alkyl.

* * * * *